US010311009B2

(12) United States Patent
Sherriff et al.

(10) Patent No.: US 10,311,009 B2
(45) Date of Patent: Jun. 4, 2019

(54) APPARATUS AND METHODS FOR COMMUNICATIVELY COUPLING FIELD DEVICES TO CONTROLLERS IN A PROCESS CONTROL SYSTEM USING A DISTRIBUTED MARSHALING ARCHITECTURE

(71) Applicant: FISHER-ROSEMOUNT SYSTEMS, INC., Round Rock, TX (US)

(72) Inventors: Godfrey R. Sherriff, Austin, TX (US); Gary K. Law, Georgetown, TX (US)

(73) Assignee: FISHER-ROSEMOUNT SYSTEMS, INC., Round Rock, TX (US)

( * ) Notice: Subject to any disclaimer, the term of this patent is extended or adjusted under 35 U.S.C. 154(b) by 86 days.

(21) Appl. No.: 15/332,355

(22) Filed: Oct. 24, 2016

(65) Prior Publication Data

US 2018/0113830 A1    Apr. 26, 2018

(51) Int. Cl.
*G06F 13/40* (2006.01)
*G05B 19/042* (2006.01)

(52) U.S. Cl.
CPC ..... *G06F 13/4068* (2013.01); *G05B 19/0423* (2013.01); *G05B 2219/1105* (2013.01)

(58) Field of Classification Search
None
See application file for complete search history.

(56) References Cited

U.S. PATENT DOCUMENTS

| 6,167,319 | A  | * | 12/2000 | Harris | G05B 11/42 700/18 |
| 6,973,508 | B2 | * | 12/2005 | Shepard | G05B 19/042 700/2 |
| 7,761,910 | B2 | * | 7/2010 | Ransom | G06F 1/28 307/38 |
| 8,645,092 | B2 | * | 2/2014 | Manning | G05B 19/41875 702/84 |
| 9,116,514 | B2 | * | 8/2015 | LaFountain | G05B 19/042 |
| 2002/0130846 | A1 | * | 9/2002 | Nixon | G05B 19/042 345/169 |

(Continued)

FOREIGN PATENT DOCUMENTS

EP    2 166 708 A2    3/2010

OTHER PUBLICATIONS

Search Report for Application No. GB1717367.5, dated Apr. 11, 2018.

*Primary Examiner* — Michael Sun
(74) *Attorney, Agent, or Firm* — Marshall, Gerstein & Borun LLP

(57) ABSTRACT

Apparatus, systems, and methods for communicating data between a controller and a multiplicity of field devices operating in a process plant are provided. The system includes distributed marshaling modules coupled by a head-end unit to I/O cards in communication with the controller. The distributed marshaling modules communicate with the field devices via respective electronic marshaling components converting signals between the field devices and the I/O cards. The distributed marshaling modules are coupled to the head-end unit by a ring communication architecture, such that the distributed marshaling modules may each be located relatively proximate to the field devices to which they are coupled.

29 Claims, 15 Drawing Sheets

(56) References Cited

U.S. PATENT DOCUMENTS

| | | | | |
|---|---|---|---|---|
| 2006/0031577 | A1* | 2/2006 | Peluso | G05B 19/4185 709/243 |
| 2007/0237137 | A1* | 10/2007 | McLaughlin | H04L 12/66 370/389 |
| 2007/0282463 | A1* | 12/2007 | Hodson | G05B 19/4186 700/20 |
| 2009/0105855 | A1* | 4/2009 | Mehta | G05B 13/048 700/89 |
| 2010/0077111 | A1* | 3/2010 | Holmes | H04L 12/40013 710/33 |

* cited by examiner

APPARATUS AND METHODS FOR COMMUNICATIVELY COUPLING FIELD DEVICES TO CONTROLLERS IN A PROCESS CONTROL SYSTEM USING A DISTRIBUTED MARSHALING ARCHITECTURE

TECHNICAL FIELD

The present disclosure relates generally to process plants and process control systems, and more particularly, to commissioning of field devices and loops of process plants and process control systems.

BACKGROUND

Distributed process control systems, like those used in chemical, petroleum, industrial or other process plants to manufacture, refine, transform, generate, or produce physical materials or products typically include one or more process controllers communicatively coupled to one or more field devices via analog, digital or combined analog/digital buses, or via a wireless communication link or network. The field devices, which may be, for example, valves, valve positioners, switches and transmitters (e.g., temperature, pressure, level and flow rate sensors), are located within the process environment and generally perform physical or process control functions such as opening or closing valves, measuring process and/or environmental parameters such as temperature or pressure, etc. to control one or more processes executing within the process plant or system. Smart field devices, such as the field devices conforming to the well-known Fieldbus protocol may also perform control calculations, alarming functions, and other control functions commonly implemented within the controller. The process controllers, which are also typically located within the plant environment, receive signals indicative of process measurements made by the field devices and/or other information pertaining to the field devices and execute a controller application that runs, for example, different control modules which make process control decisions, generate control signals based on the received information and coordinate with the control modules or blocks being performed in the field devices, such as HART®, WirelessHART®, and FOUNDATION® Fieldbus field devices. The control modules in the controller send the control signals over the communication lines or links to the field devices to thereby control the operation of at least a portion of the process plant or system, e.g., to control at least a portion of one or more industrial processes running or executing within the plant or system. For example, the controllers and the field devices control at least a portion of a process being controlled by the process plant or system. I/O devices, which are also typically located within the plant environment, typically are disposed between a controller and one or more field devices, and enable communications there between, e.g. by converting electrical signals into digital values and vice versa. As utilized herein, field devices, controllers, and I/O devices are generally referred to as "process control devices," and are generally located, disposed, or installed in a field environment of a process control system or plant.

Information from the field devices and the controller is usually made available over a data highway or communication network to one or more other hardware devices, such as operator workstations, personal computers or computing devices, data historians, report generators, centralized databases, or other centralized administrative computing devices that are typically placed in control rooms or other locations away from the harsher field environment of the plant, e.g., in a back-end environment of the process plant. Each of these hardware devices typically is centralized across the process plant or across a portion of the process plant. These hardware devices run applications that may, for example, enable an operator to perform functions with respect to controlling a process and/or operating the process plant, such as changing settings of the process control routine, modifying the operation of the control modules within the controllers or the field devices, viewing the current state of the process, viewing alarms generated by field devices and controllers, simulating the operation of the process for the purpose of training personnel or testing the process control software, keeping and updating a configuration database, etc. The data highway utilized by the hardware devices, controllers and field devices may include a wired communication path, a wireless communication path, or a combination of wired and wireless communication paths.

As an example, the DeltaV™ control system, sold by Emerson Process Management, includes multiple applications stored within and executed by different devices located at diverse places within a process plant. A configuration application, which resides in one or more workstations or computing devices in a back-end environment of a process control system or plant, enables users to create or change process control modules and download these process control modules via a data highway to dedicated distributed controllers. Typically, these control modules are made up of communicatively interconnected function blocks, which are objects in an object oriented programming protocol that perform functions within the control scheme based on inputs thereto and that provide outputs to other function blocks within the control scheme. The configuration application may also allow a configuration designer to create or change operator interfaces which are used by a viewing application to display data to an operator and to enable the operator to change settings, such as set points, within the process control routines. Each dedicated controller and, in some cases, one or more field devices, stores and executes a respective controller application that runs the control modules assigned and downloaded thereto to implement actual process control functionality. The viewing applications, which may be executed on one or more operator workstations (or on one or more remote computing devices in communicative connection with the operator workstations and the data highway), receive data from the controller application via the data highway and display this data to process control system designers, operators, or users using the user interfaces, and may provide any of a number of different views, such as an operator's view, an engineer's view, a technician's view, etc. A data historian application is typically stored in and executed by a data historian device that collects and stores some or all of the data provided across the data highway while a configuration database application may run in a still further computer attached to the data highway to store the current process control routine configuration and data associated therewith. Alternatively, the configuration database may be located in the same workstation as the configuration application.

Generally, the commissioning of a process plant or system involves bringing various components of the plant or system to the point where the system or plant can operate as intended. As is commonly known, physical process elements (such as valves, sensors, etc. that are to be utilized to control a process in a process plant) are installed at respective locations within the field environment of the plant, e.g., in accordance with Piping and Instrumentation Diagrams (P&IDs) and/or other plans or "blueprints" of the plant floor layout and/or of the process layout. After the process elements have been installed, at least some of the process elements are commissioned. For example, field devices, sampling points, and/or other elements are subject to being commissioned. Commissioning is an involved and complex process which typically includes multiple actions or activities. For example, commissioning may include actions or activities such as, among other things, verifying or confirming an identity of an installed process control device (such as a field device) and its expected connections; determining and providing tags that uniquely identify the process control device within the process control system or plant; setting or configuring initial values of parameters, limits, etc. for the device; verifying the correctness of the device's installation, operation and behaviors under various conditions, e.g., by manipulating signals provided to the devices and performing other tests, and other commissioning activities and actions. Device verification during commissioning is important for safety reasons, as well as to conform to regulatory and quality requirements.

Other commissioning actions or activities are performed on a process control loop in which the device is included. Such commissioning actions or activities include, for example, verifying that various signal sent across the interconnection results in expected behavior at both ends of the interconnection, integrity checks on the process control loop, generating as-built I/O lists to indicate the actual physical connections of the devices that are implemented within the plant as well as recording other "as-installed" data, to name a few.

For some commissioning tasks, a user may utilize a commissioning tool (e.g., a handheld or portable computing device) locally at various target process control devices, components, and loops. Some commissioning tasks may be performed at an operator interface of the process control system, e.g., at an operator interface of an operator workstation included in a back-end environment of the process plant.

Typically, the commissioning of a process plant requires physical devices, connections, wiring, etc. to be installed, set up, and inter-connected in the field environment of the process plant. At the back-end environment of the plant (e.g., at the centralized administrative computing devices such as operator workstations, personal computers or computing devices, centralized databases, configuration tools, etc. that are typically placed in control rooms or other locations away from the harsher field environment of the plant), data that specifically identifies and/or addresses the various devices, their configurations, and their interconnections is integrated, verified or commissioned, and stored. As such, after the physical hardware has been installed and configured, identification information, logical instructions, and other instructions and/or data is downloaded or otherwise provided to the various devices disposed in the field environment so that the various devices are able to communicate with other devices.

Of course, in addition to commissioning actions performed in the back-end environment, commissioning actions or activities are also performed to verify the correctness of the connections and operations in the field environment of both the physical and logical devices, both individually and integrally. For example, a field device may be physically installed and individually verified, e.g., power-on, power-off, etc. A port of a field device may then be physically connected to a commissioning tool via which simulated signals may be sent to the field device, and the behavior of the field device in response to the various simulated signals may be tested. Similarly, a field device whose communication port is commissioned may eventually be physically connected to a terminal block, and actual communications between the terminal block and the field device may be tested. Typically, commissioning of field devices and/or other components in the field environment requires knowledge of component identifications, and in some cases, knowledge of component interconnections so that test signals and responses can be communicated amongst field devices and other loop components and resultant behaviors verified. In currently known commissioning techniques, such identification and interconnection knowledge or data is generally provided to components in the field environment by the back-end environment. For example, the back-end environment will download field device tags that are used in control modules into the field devices that will be controlled by the control modules during live plant operations.

Coupling the field devices' communication ports to the terminal block and, eventually, to the controllers in the back-end environment is generally a complex process. Field devices must be coupled to I/O cards that translate the signals received from the field devices to signals that can be processed by the controllers, and that translate the signals received from the controllers to signals that can be processed by the field devices. Each channel of each I/O card, corresponding to a particular field device, must be associated with the appropriate signal types (so that signals are processed appropriately by the I/O card) and the I/O card must be communicatively coupled to the controller or controllers that will eventually be receiving signals from and/or sending signals to the field devices coupled to that I/O card.

A termination block for a particular area typically serves as the termination point for the wiring (or connection) of field devices from a particular physical area of the process plant, which will be appreciated is a significant amount of wiring in order to couple field devices spread out over an area of a process control facility to the corresponding termination block. A marshaling cabinet in the termination area includes a multiplicity of communication modules that marshal, organize or route signals between the communication modules coupled to the field devices and one or more I/O cards communicatively coupled to the controllers. In addition to the terminal blocks and communication modules, the marshaling cabinet also includes power provisioning to supply power to the I/O cards and the communication modules, power dissipation mechanisms (e.g., heat sinks, fans, etc.) to keep components in the marshaling cabinet from overheating, all of the wiring coming in from the field devices, and various solutions for keeping that wiring from becoming too unwieldy.

SUMMARY

Techniques, systems, apparatuses, components, devices, and methods for implementing distributed marshaling architectures in process control plants are disclosed herein. Said techniques, systems, apparatuses, components, devices, and methods may apply to industrial process control systems, environments, and/or plants, which are interchangeably referred to herein as "industrial control," "process control," or "process" systems, environments, and/or plants. Typically, such systems and plants provide control, in a distributed manner, of one or more processes (also referred herein as "industrial processes") that operate to manufacture, refine, or transform, raw physical materials to generate or produce products.

The distributed marshaling architectures include various techniques, systems, apparatuses, components, and/or methods that allow for at least some portions of the electronic marshaling (the communicative connection of field devices to I/O cards to controllers) to be more widely distributed than previous systems allowed. Distributed marshaling allows, for example, various portions of process control systems and/or their respective safety instrumented systems (SIS) (e.g., stand-alone or integrated safety systems (ICSS)) to be communicatively coupled to I/O cards and controllers with significantly shorter wiring runs, smaller power provisioning requirements, fewer heat dissipation requirements and, in general, greater flexibility.

For example, distributed marshaling allows field devices to be communicatively coupled by short wiring runs to local marshaling modules that, in turn, are coupled via high speed networking connections to one another and to a head-end unit that is, in turn, coupled to I/O cards and controllers. As such, a significant portion of local commissioning activities of the physical components of the field environment may be eliminated, specifically as concerns the routing of long runs of wiring between a multiplicity of field devices, spread over a physical area of the process plant, and a centralized marshaling cabinet at which all of the wiring runs are terminated. The design and installation of power provisions and heat dissipation components for the centralized marshaling cabinets may likewise be eliminated.

A process control system operating to control a process in a process plant includes a plurality of process control field devices, an input/output (I/O) card communicatively coupled to the plurality of process control field devices, and a controller, communicatively coupled to the I/O card and receiving, via the I/O card, data from the plurality of process control field devices, and operating to send, also via the I/O card, control signals to one or more of the process control field devices to control the operation of the process. The process control system also includes a distributed marshaling module that includes a pair of communication ports, one or more electronic marshaling component slots, at least one electronic marshaling component slot having disposed therein an electronic marshaling component, and a respective terminal block corresponding to each of the one or more electronic marshaling component slots, the terminal block for the at least one electronic marshaling component slot being communicatively coupled to one of the plurality of field devices. A microprocessor, coupled to the pair of communication ports is also included on the distributed marshaling module. The system further includes a head-end module. The head-end module has a first communication port coupling the head-end module to the I/O card, a pair of second communication ports communicatively coupled to the distributed marshaling module, a memory device having stored thereon a database storing information received by the microprocessor via the pair of second communication ports, and a microprocessor coupled to the memory device. The microprocessor is configured to receive and transmit data via the pair of second communication ports, store received data to the memory device, retrieve data from the memory device, and transmit retrieved data to the controller via the I/O card.

A distributed marshaling module for coupling field devices in a process plant to a controller in the process plant includes a pair of communication ports. A first number of electronic marshaling component slots is disposed on the distributed marshaling module which also includes a second number, equal to the first number, of terminal blocks, each terminal block in communicative connection with one of the electronic marshaling component slots and configured to be communicatively connected to a respective one of the field devices. Still further, the distributed marshaling module includes a third number, less than or equal to the first number, of electronic marshaling components disposed in the electronic marshaling component slots, each of the electronic marshaling components configured to receive a signal from the respective one of the field devices and to convert the received signal to a format compatible with an I/O card, and a microprocessor coupled to the pair of communication ports.

A head-end module for coupling field devices in a process plant to a controller in the process plant includes a first communication port communicatively connecting the head-end module to a first distributed marshaling module, the first distributed marshaling module part of a first ring architecture. A second communication port communicatively connecting the head-end module to a second distributed marshaling module, the second distributed marshaling module part of the first ring architecture, is also part of the head-end module. Further, the head-end module includes a third communication port communicatively connecting the head-end module to an I/O card, the I/O card communicatively connected, in turn, to the controller. Further still, the head-end module includes a memory device and a microprocessor, coupled to the memory device. The microprocessor is configured to receive, via one or both of the first and second communication ports, first data from field devices coupled to the first and second distributed marshaling modules, store the received first data to a database disposed in the memory device, retrieve the received first data from the database, transmit the retrieved first data to the controller via the I/O card, receive second data from the controller via the I/O card, and transmit, via one or both of the first and second communication ports, the second data to specified ones of the field devices.

41. A method of communicating data from a field device in a process plant to a controller in the process plant includes receiving from the field device, at a terminal block, a signal representative of the data. The method further includes converting, in an electronic marshaling component communicatively connected to the terminal block, the received signal to a second signal, and registering the second signal from the electronic marshaling component. The method also includes transmitting, from a microprocessor, to a head-end module remote from the microprocessor and the electronic marshaling component, via either a first communication port or a second communication port, a signal indicative of the registered second signal.

DETAILED DESCRIPTION

As discussed above, a process plant, process control system, or process control environment that, when on-line, operates to control one or more industrial processes in real-time may be communicatively connected during commissioning utilizing one or more of the novel techniques, systems, apparatuses, components, devices, and/or methods described herein. The process plant, when commissioned and operating on-line, includes one or more wired or wireless process control devices, components, or elements that perform physical functions in concert with a process control system to control one or more processes executing within the process plant. The process plant and/or process control system may include, for example, one or more wired communication networks and/one or more wireless communication networks. Additionally, the process plant or control system may include centralized databases, such as continuous, batch, asset management, historian, and other types of databases.

Figure 1:
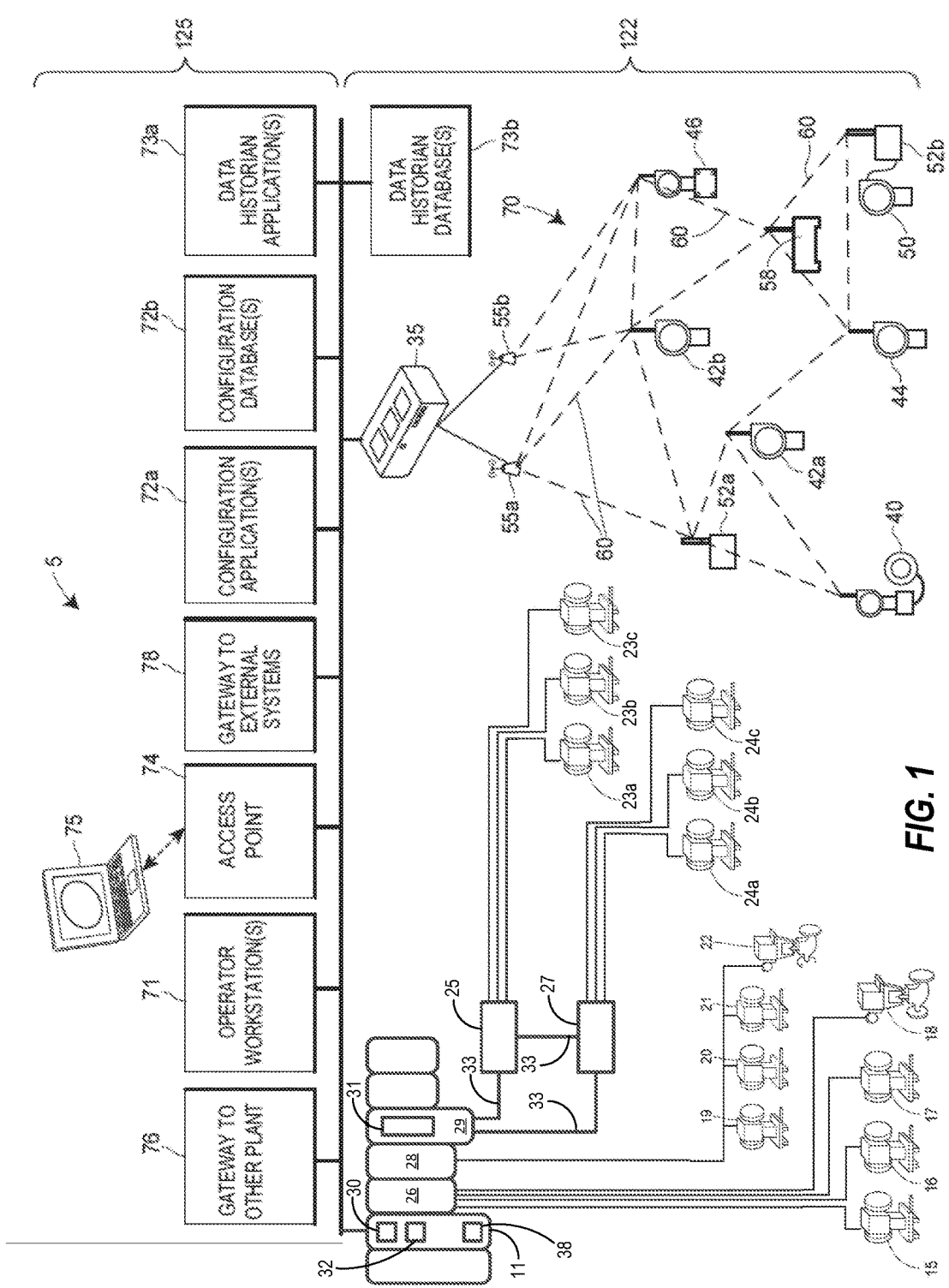
FIG. 1 depicts a block diagram illustrating an example system process plant, at least a portion of which implement a distributed marshaling architecture as described herein.

To illustrate, FIG. 1 is a block diagram of an example process plant, process control system, or process control environment 5, at least a portion of which has been commissioned by using any one or more of the techniques and apparatuses described herein. The process plant 5 includes one or more process controllers that receive signals indicative of process measurements made by field devices, process this information to implement a control routine, and generate control signals that are sent over wired or wireless process control communication links or networks to other field devices to control the operation of a process in the plant 5. Typically, at least one field device performs a physical function (e.g., opening or closing a valve, increasing or decreasing a temperature, taking a measurement, sensing a condition, etc.) to control the operation of a process. Some types of field devices communicate with controllers by using I/O devices. Process controllers, field devices, and I/O devices may be wired or wireless, and any number and combination of wired and wireless process controllers, field devices and I/O devices may be included in the process plant environment or system 5.

For example, FIG. 1 illustrates a process controller 11 that is communicatively connected to wired field devices 15-22 via input/output (I/O) cards 26 and 28, and to wired field devices 23a-c and 24a-c by an I/O card 31 communicatively connected to a head-end unit 29. The controller 11 is communicatively connected to wireless field devices 40-46 via a wireless gateway 35 and a process control data highway or backbone 10. The process control data highway 10 may include one or more wired and/or wireless communication links, and may be implemented using any desired suitable or communication protocol such as, for example, an Ethernet protocol. In some configurations (not shown), the controller 11 may be communicatively connected to the wireless gateway 35 using one or more communications networks other than the backbone 10, such as by using any number of other wired or wireless communication links that support one or more communication protocols, e.g., Wi-Fi or other IEEE 802.11 compliant wireless local area network protocol, mobile communication protocol (e.g., WiMAX, LTE, or other ITU-R compatible protocol), Bluetooth®, HART®, WirelessHART®, Profibus, FOUNDATION® Fieldbus, etc.

The controller 11, which may be, by way of example, the DeltaV controller sold by Emerson Process Management, may operate to implement a batch process or a continuous process using at least some of the field devices 15-22 and 40-46. In an embodiment, in addition to being communicatively connected to the process control data highway 10, the controller 11 is also communicatively connected to at least some of the field devices 15-22 and 40-46 using any desired hardware and software associated with, for example, standard 4-20 mA devices, I/O cards 26, 28, and/or any smart communication protocol such as the FOUNDATION® Fieldbus protocol, the HART® protocol, the WirelessHART® protocol, etc. In FIG. 1, the controller 11, the field devices 15-22 and the I/O cards 26, 28 are wired devices, and the field devices 40-46 are wireless field devices. Of course, the wired field devices 15-22 and wireless field devices 40-46 could conform to any other desired standard(s) or protocols, such as any wired or wireless protocols, including any standards or protocols developed in the future.

The process controller 11 of FIG. 1 includes a processor 30 that implements or oversees one or more process control routines 38 (e.g., that are stored in a memory 32). The processor 30 is configured to communicate with the field devices 15-22 and 40-46 and with other nodes communicatively connected to the controller 11. It should be noted that any control routines or modules described herein may have parts thereof implemented or executed by different controllers or other devices if so desired. Likewise, the control routines or modules 38 described herein which are to be implemented within the process control system 5 may take any form, including software, firmware, hardware, etc. Control routines may be implemented in any desired software format, such as using object oriented programming, ladder logic, sequential function charts, function block diagrams, or using any other software programming language or design paradigm. The control routines 38 may be stored in any desired type of memory 32, such as random access memory (RAM), or read only memory (ROM). Likewise, the control routines 38 may be hard-coded into, for example, one or more EPROMs, EEPROMs, application specific integrated circuits (ASICs), or any other hardware or firmware elements. Thus, the controller 11 may be configured to implement a control strategy or control routine in any desired manner.

The controller 11 implements a control strategy using what are commonly referred to as function blocks, where each function block is an object or other part (e.g., a subroutine) of an overall control routine and operates in conjunction with other function blocks (via communications called links) to implement process control loops within the process control system 5. Control based function blocks typically perform one of an input function, such as that associated with a transmitter, a sensor or other process parameter measurement device, a control function, such as that associated with a control routine that performs PID, fuzzy logic, etc. control, or an output function which controls the operation of some device, such as a valve, to perform some physical function within the process control system 5. Of course, hybrid and other types of function blocks exist. Function blocks may be stored in and executed by the controller 11, which is typically the case when these function blocks are used for, or are associated with standard 4-20 mA devices and some types of smart field devices such as HART® devices, or may be stored in and implemented by the field devices themselves, which can be the case with FOUNDATION® Fieldbus devices. The controller 11 may include one or more control routines 38 that may implement one or more control loops, which are performed by executing one or more of the function blocks.

The wired field devices 15-22 may be any types of devices, such as sensors, valves, transmitters, positioners, etc., while the I/O cards 26 and 28 may be any types of I/O devices conforming to any desired communication or controller protocol. In FIG. 1, the field devices 15-® are standard 4-20 mA devices or HART® devices that communicate over analog lines or combined analog and digital lines to the I/O card 26, while the field devices 19-22 are smart devices, such as FOUNDATION® Fieldbus field devices, that communicate over a digital bus to the I/O card 28 using a FOUNDATION® Fieldbus communications protocol. In some embodiments, though, at least some of the wired field devices 15, 16 and 18-21 and/or at least some of the I/O cards 26, 28 additionally or alternatively communicate with the controller 11 using the process control data highway 10 and/or by using other suitable control system protocols (e.g., Profibus, DeviceNet, Foundation Fieldbus, ControlNet, Modbus, HART, etc.).

At the same time, the wired field devices 23*a-c* and 24*a-c* may be any types of devices, including sensors, valves, transmitters, positioners, etc., and may communicate, using analog and/or digital signals, with the I/O card 31, which, as will be described, may be coupled to any type of field device by an electronic marshaling component (not depicted in FIG. 1) that converts signals between those used by the field device, and those compatible with the I/O card 31. Each of the field devices 23*a*-23*c* is coupled to a local distributed marshaling module 25, while each of the field devices 24*a*-24*c* is coupled to a local distributed marshaling module 27. The distributed marshaling modules 25, 27 carry an electronic marshaling component for each of the field devices 23*a-c*, 24*a-c* coupled to the respective distributed marshaling module. While each of the distributed marshaling modules 25, 27 is depicted in FIG. 1 as having three field devices 23*a-c*, 24*a-c* coupled to it, it will be apparent through the remainder of the description that each of the distributed marshaling modules 25, 27 may carry any number of electronic marshaling components supporting any number of corresponding field devices. The distributed marshaling modules 25, 27 communicate with the head-end unit 29 via a network 33 having a ring architecture, the head-end unit 29 conveying data to the I/O card 31 and, ultimately, to the controller 11.

In FIG. 1, the wireless field devices 40-46 communicate via a wireless process control communication network 70 using a wireless protocol, such as the WirelessHART® protocol. Such wireless field devices 40-46 may directly communicate with one or more other devices or nodes of the wireless network 70 that are also configured to communicate wirelessly (using the wireless protocol or another wireless protocol, for example). To communicate with one or more other nodes that are not configured to communicate wirelessly, the wireless field devices 40-46 may utilize a wireless gateway 35 connected to the process control data highway 10 or to another process control communications network. The wireless gateway 35 provides access to various wireless devices 40-58 of the wireless communications network 70. In particular, the wireless gateway 35 provides communicative coupling between the wireless devices 40-58, the wired devices 11-28, and/or other nodes or devices of the process control plant 5. For example, the wireless gateway 35 may provide communicative coupling by using the process control data highway 10 and/or by using one or more other communications networks of the process plant 5.

Similar to the wired field devices 15-22, the wireless field devices 40-46 of the wireless network 70 perform physical control functions within the process plant 5, e.g., opening or closing valves, or taking measurements of process parameters. The wireless field devices 40-46, however, are configured to communicate using the wireless protocol of the network 70. As such, the wireless field devices 40-46, the wireless gateway 35, and other wireless nodes 52-58 of the wireless network 70 are producers and consumers of wireless communication packets.

In some configurations of the process plant 5, the wireless network 70 includes non-wireless devices. For example, in FIG. 1, a field device 48 of FIG. 1 is a legacy 4-20 mA device and a field device 50 is a wired HART® device. To communicate within the network 70, the field devices 48 and 50 are connected to the wireless communications network 70 via a wireless adaptor 52*a*, 52*b*. The wireless adaptors 52*a*, 52*b* support a wireless protocol, such as WirelessHART, and may also support one or more other communication protocols such as Foundation® Fieldbus, PROFIBUS, DeviceNet, etc. Additionally, in some configurations, the wireless network 70 includes one or more network access points 55*a*, 55*b*, which may be separate physical devices in wired communication with the wireless gateway 35 or may be provided with the wireless gateway 35 as an integral device. The wireless network 70 may also include one or more routers 58 to forward packets from one wireless device to another wireless device within the wireless communications network 70. In FIG. 1, the wireless devices 40-46 and 52-58 communicate with each other and with the wireless gateway 35 over wireless links 60 of the wireless communications network 70, and/or via the process control data highway 10.

In FIG. 1, the process control system 5 includes one or more operator workstations 71 that are communicatively connected to the data highway 10. Via the operator workstations 71, operators may view and monitor run-time operations of the process plant 5, as well as take any diagnostic, corrective, maintenance, and/or other actions that may be required. At least some of the operator workstations 71 may be located at various, protected areas in or near the plant 5, and in some situations, at least some of the operator workstations 71 may be remotely located, but nonetheless in communicative connection with the plant 5. Operator workstations 71 may be wired or wireless computing devices.

The example process control system 5 is further illustrated as including a configuration application 72*a* and configuration database 72*b*, each of which is also communicatively connected to the data highway 10. As discussed above, various instances of the configuration application 72*a* may execute on one or more computing devices (not shown) to enable users to create or change process control modules and download these modules via the data highway 10 to the controllers 11, as well as enable users to create or change operator interfaces via which in operator is able to view data and change data settings within process control routines. The configuration database 72*b* stores the created (e.g., configured) modules and/or operator interfaces. Generally, the configuration application 72*a* and configuration database 72*b* are centralized and have a unitary logical appearance to the process control system 5, although multiple instances of the configuration application 72*a* may execute simultaneously within the process control system 5, and the configuration database 72*b* may be implemented across multiple physical data storage devices. Accordingly, the configuration application 72*a*, configuration database 72*b*, and user interfaces thereto (not shown) comprise a configuration or development system 72 for control and/or display modules. Typically, but not necessarily, the user interfaces for the configuration system 72 are different than the operator workstations 71, as the user interfaces for the configuration system 72 are utilized by configuration and development engineers irrespective of whether or not the plant 5 is operating in real-time, whereas the operator workstations 71 are utilized by operators during real-time operations of the process plant 5 (also referred to interchangeably here as "run-time" operations of the process plant 5).

The example process control system 5 includes a data historian application 73*a* and data historian database 73*b*, each of which is also communicatively connected to the data highway 10. The data historian application 73*a* operates to collect some or all of the data provided across the data highway 10, and to historize or store the data in the historian database 73*b* for long term storage. Similar to the configuration application 72*a* and configuration database 72*b*, the data historian application 73*a* and historian database 73*b* are centralized and have a unitary logical appearance to the process control system 5, although multiple instances of a data historian application 73*a* may execute simultaneously within the process control system 5, and the data historian 73*b* may be implemented across multiple physical data storage devices.

In some configurations, the process control system 5 includes one or more other wireless access points 74 that communicate with other devices using other wireless protocols, such as Wi-Fi or other IEEE 802.11 compliant wireless local area network protocols, mobile communication protocols such as WiMAX (Worldwide Interoperability for Microwave Access), LTE (Long Term Evolution) or other ITU-R (International Telecommunication Union Radiocommunication Sector) compatible protocols, short-wavelength radio communications such as near field communications (NFC) and Bluetooth, or other wireless communication protocols. Typically, such wireless access points 74 allow handheld or other portable computing devices (e.g., user interface devices 75) to communicate over a respective wireless process control communication network that is different from the wireless network 70 and that supports a different wireless protocol than the wireless network 70. For example, a wireless or portable user interface device 75 may be a mobile workstation or diagnostic test equipment that is utilized by an operator within the process plant 5 (e.g., an instance of one of the operator workstations 71). In some scenarios, in addition to portable computing devices, one or more process control devices (e.g., controller 11, field devices 15-22, or wireless devices 35, 40-58) also communicate using the wireless protocol supported by the access points 74.

In some configurations, the process control system 5 includes one or more gateways 76, 78 to systems that are external to the immediate process control system 5. Typically, such systems are customers or suppliers of information generated or operated on by the process control system 5. For example, the process control plant 5 may include a gateway node 76 to communicatively connect the immediate process plant 5 with another process plant. Additionally or alternatively, the process control plant 5 may include a gateway node 78 to communicatively connect the immediate process plant 5 with an external public or private system, such as a laboratory system (e.g., Laboratory Information Management System or LIMS), an operator rounds database, a materials handling system, a maintenance management system, a product inventory control system, a production scheduling system, a weather data system, a shipping and handling system, a packaging system, the Internet, another provider's process control system, or other external systems.

It is noted that although FIG. 1 only illustrates a single controller 11 with a finite number of field devices 15-22 and 40-46, wireless gateways 35, wireless adaptors 52, access points 55, routers 58, and wireless process control communications networks 70 included in the example process plant 5, this is only an illustrative and non-limiting embodiment. Any number of controllers 11 may be included in the process control plant or system 5, and any of the controllers 11 may communicate with any number of wired or wireless devices and networks 15-22, 40-46, 35, 52, 55, 58 and 70 to control a process in the plant 5. For example, the process plant 5 may include various physical areas, each having an associated one or more controllers 11 in communication (via additional I/O cards 26, 28) with an associated set of field devices and networks 15-22, 40-46, 35, 52, 55, 58 and 70 in that physical area.

Further, it is noted that the process plant or control system 5 of FIG. 1 includes a field environment 122 (e.g., "the process plant floor 122") and a back-end environment 125 which are communicatively connected by the data highway 10. As shown in FIG. 1, the field environment 122 includes physical components (e.g., process control devices, networks, network elements, etc.) that are disposed, installed, and interconnected therein to operate to control the process during run-time. For example, the controller 11, the I/O cards 26,28, the field devices 15-22, and other devices and network components 40-46, 35, 52, 55, 58 and 70 are located, disposed, or otherwise included in the field environment 122 of the process plant 5. Generally speaking, in the field environment 122 of the process plant 5, raw materials are received and processed using the physical components disposed therein to generate one or more products.

The back-end environment 125 of the process plant 5 includes various components such as computing devices, operator workstations, databases or databanks, etc. that are shielded and/or protected from the harsh conditions and materials of the field environment 122. Referring to FIG. 1, the back-end environment 125 includes, for example, the operator workstations 71, the configuration or development systems 72 for control modules and other executable modules, data historian systems 73, and/or other centralized administrative systems, computing devices, and/or functionality that support the run-time operations of the process plant 5. In some configurations, various computing devices, databases, and other components and equipment included in the back-end environment 125 of the process plant 5 may be physically located at different physical locations, some of which may be local to the process plant 5, and some of which may be remote.

Figure 2A:
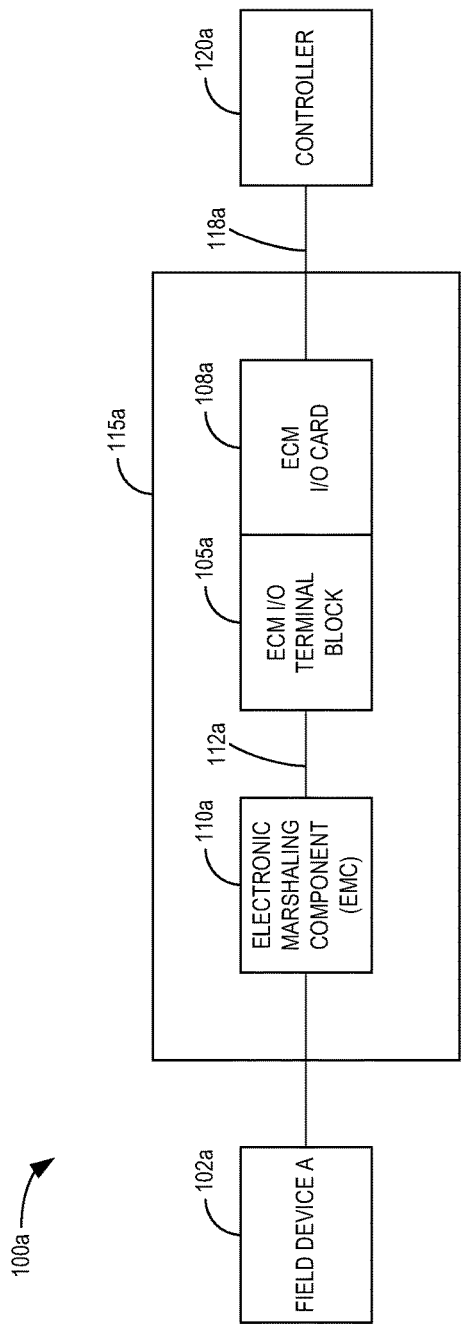
FIG. 2A includes a block diagram of an example control loop which may be included in the process plant of FIG. 1 and which may be at least partially implemented using the distributed marshaling architecture.

FIGS. 2A to 2G generally describe the non-distributed portions of the communication architecture, corresponding to the I/O cards 26, 28, and the field devices 15-22, though the concepts described with respect to FIGS. 2A to 2G are, in large part, extendible to the distributed portion of the architecture, as will later be apparent. FIG. 2A includes a block diagram depicting an example architecture of an example process control loop 100a in which a smart or intelligent field device 102a is included, and that may be commissioned using any one or more of the techniques described herein. Generally, as used herein, "smart" or "intelligent" field devices are field devices that integrally include one or more processors and one or more memories. On the other hand, as used herein, "dumb" or "legacy" field devices do not include on-board processor(s) and/or on-board memories.

The loop 100a may be integrated or incorporated into a process plant to be utilized in controlling a process therein during run-time operations of the process plant. For example, the loop 100a may be installed or disposed in the field environment 122 of the process plant 5.

Within the example process control loop 100a shown in FIG. 2A, a smart or intelligent field device 102a is communicatively connected (e.g., in a wired or wireless manner) to an electronic marshaling device or component (EMC) 110a (e.g., a CHARacterization Module or CHARM provided by Emerson Process Management). The EMC 110a is communicatively connected 112a to an I/O terminal block 105a that, in turn, is communicatively connected to an I/O card 108a. The I/O card 108a is communicatively connected 118a to a controller 120a, which, in turn, is communicatively connected 121a to the back-end environment 125 of the process plant 5. During on-line operations of the process plant 5, the process controller 120a receives digital values of the signals generated by the smart field device 102a and operates on the received values to control a process within the plant 5, and/or sends signals to change the operation of the field device 102a. Additionally, the controller 120a may send information to and receive information from the back-end environment 125 via the communicative connection 121a.

In FIG. 2A, the electronic marshaling component 110a, the I/O terminal block 105a, and the I/O card 108a are depicted as being located together in a cabinet or housing 115a (such as an I/O cabinet) that electrically interconnects the electronic marshaling component 110a, the I/O terminal block 105a, and the I/O card 108a and/or other components housed within the cabinet 115a via a bus, backplane, or other suitable interconnection mechanism. Of course, the housing of the electronic marshaling component 110a, the I/O terminal block 105a, and the I/O card 108a in the cabinet 115a as depicted in FIG. 2A is only one of many housing configurations possible.

Figure 2B:
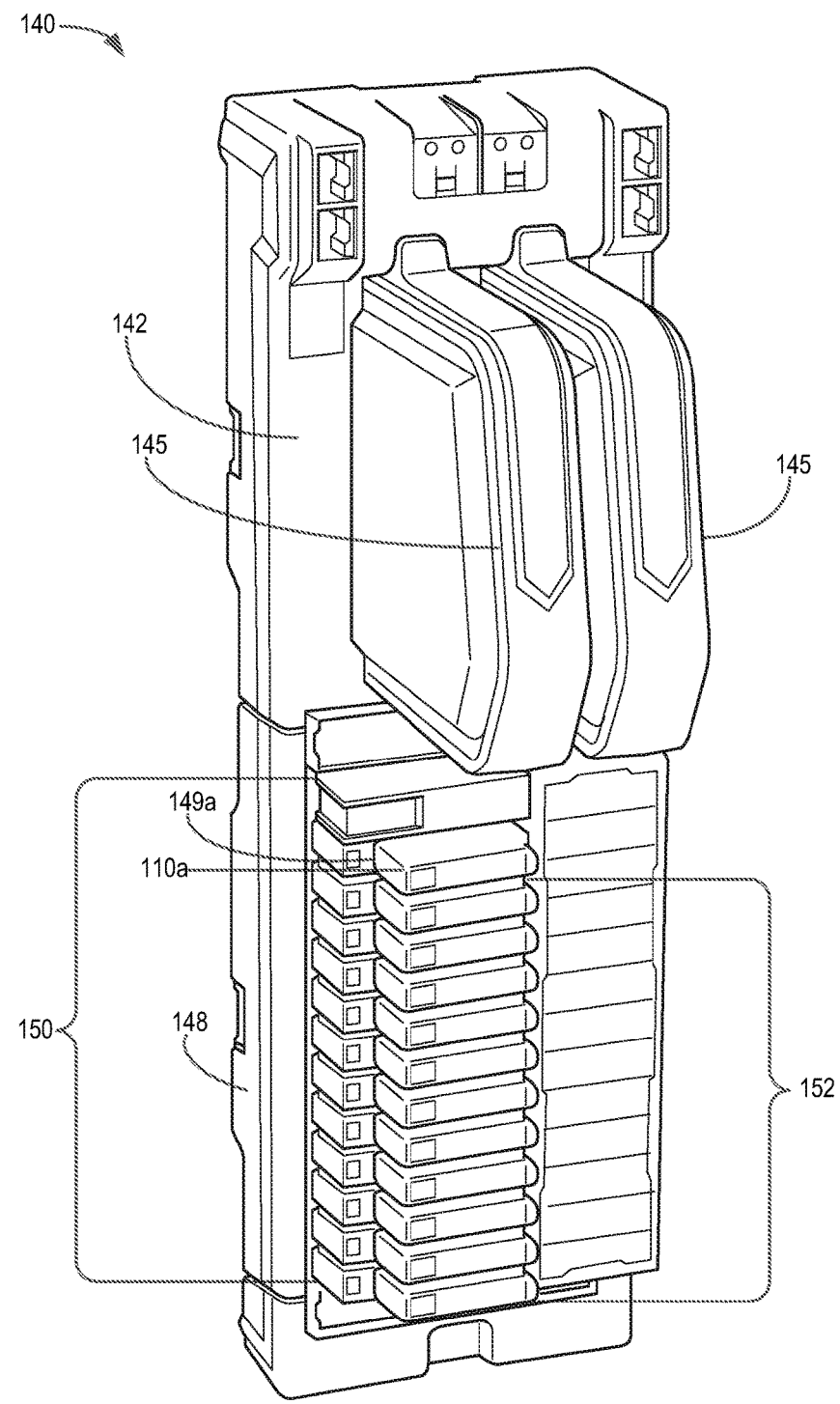
FIG. 2B illustrates an example architecture of an electronic marshaling block or apparatus which may be included in the process plant of FIG. 1.

With particular regard to the electronics marshaling component 110a, FIG. 2B illustrates a perspective view of an example electronic marshaling block or apparatus 140 that supports the EMC 110a shown in FIG. 2A, and thus is discussed below with simultaneous reference to FIG. 2A. In FIG. 2B, the electronic marshaling block or apparatus 140 includes an I/O card carrier 142 that supports one or more EMC I/O cards 145 to which the process controller 120a may be connected (e.g., via the wired or wireless connection 118a shown in FIG. 2A). Additionally, the electronic marshaling block or apparatus 140 includes one or more electronic marshaling modules 148 that communicatively connect to the I/O card carrier 142 (and therefore, to the EMC I/O cards 145), and that support a plurality of individually configurable channels. Each channel corresponds to a dedicated terminal of the EMC terminal block 150, coupled to an EMC slot 149a into which the EMC 110a may be securely received and electronically connected, thereby electronically marshaling the field device 102a and the I/O card 108a with the controller 120a. For instance, the I/O terminal block 105a is the EMC terminal block 150 coupled to the EMC slot 149a into which the EMCs 110a and 152 are received, and the I/O card 108a is the EMC I/O card 145 corresponding to the EMC terminal block 150 and to which the controller 120a is connected 118a. FIG. 2B also shows other EMCs 152 which have been received by their respective EMC terminal blocks 150, and which may be connected to other respective devices in the field environment 122 of the process plant 5 (not shown).

As depicted in FIG. 2B, in embodiments a pair of redundant I/O cards 145 (e.g., a primary I/O card 108a and a secondary I/O card 108a') is fitted to provide fault tolerant operations in the event that one of the redundant I/O cards 108a, 108a' fails. In the event of such a failure, for example the failure of the primary I/O card 108a, the remaining one of the redundant I/O cards 108a, 108a' (e.g., the secondary I/O card 108a') assumes control and performs the same operations that would otherwise have been performed by the failed I/O card.

Figure 2C:
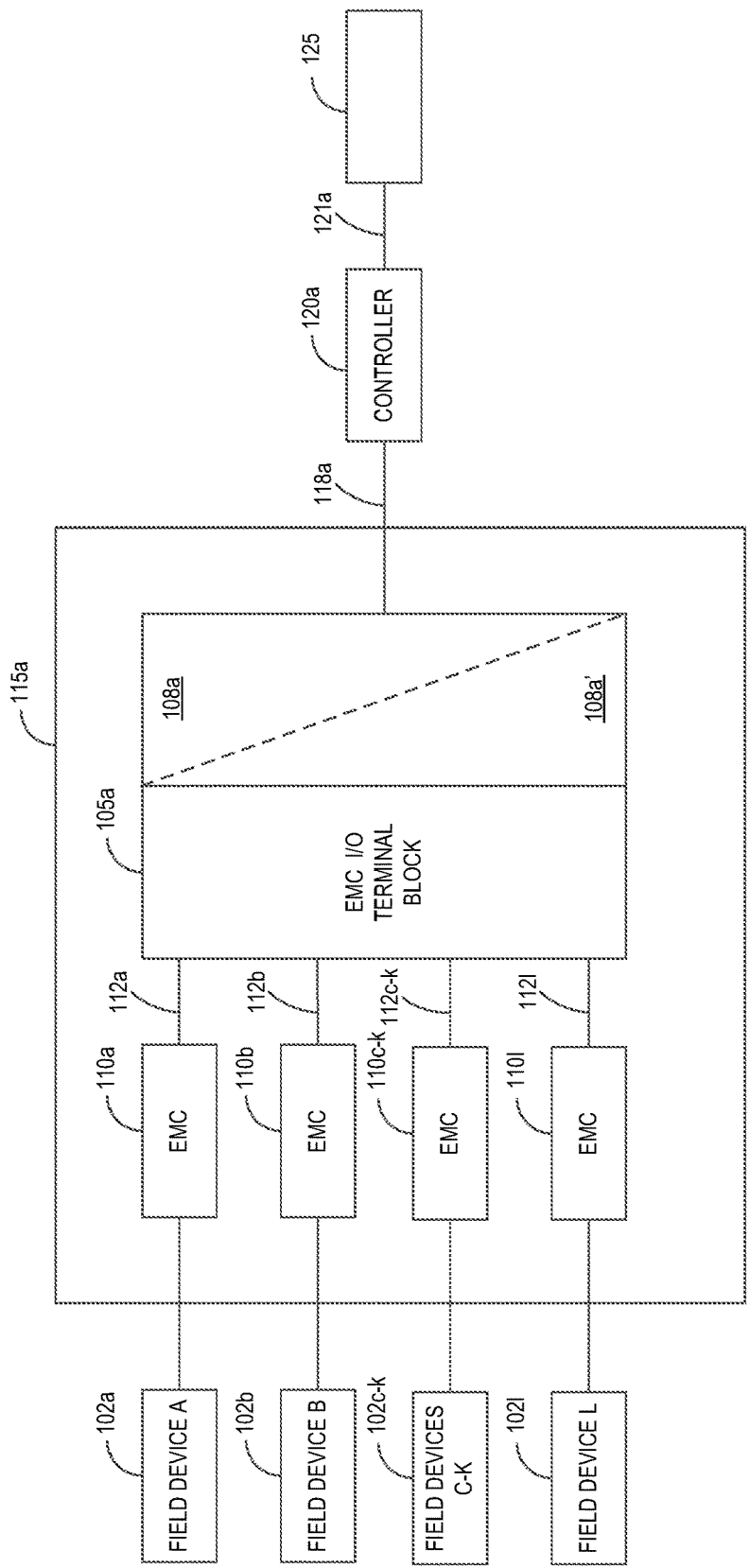
FIG. 2C depicts a block diagram of an implementation of example loops which may be included in the process plant of FIG. 1 and which may be at least partially commissioned utilizing the distributed marshaling architecture.

As should be apparent with reference to FIG. 2B, each electronic marshaling module 148 supports a plurality of configurable channels, each of which corresponds to an individual EMC. Such a configuration is depicted in FIG. 2C. FIG. 2C depicts a multiplicity of field devices 102a-102l. Each of the field devices 102a-102l is communicatively connected (e.g., in a wired or wireless manner) to a corresponding electronic marshaling component 110a-110l. Each of the electronic marshaling components 110a-110l is communicatively connected 112a-112l to the same I/O terminal block (just as the EMC 110a and the other EMCs 152 are all coupled to the terminal block 150 in FIG. 2B) that, in turn, is communicatively coupled to redundant I/O cards 108a, 108a'. The redundant I/O cards 108a, 108a' are communicatively connected 118a to the controller 120a, which, in turn, is communicatively connected 121a to the back-end environment 125 of the process plant 5. The electronic marshaling components 110a-1, the I/O terminal block 150, and the redundant I/O cards 108a, 108a' may all be enclosed in the cabinet 115a. While in the embodiment depicted in FIG. 2C, the I/O terminal block 105a supports 12 electronic marshaling components (e.g., 110a-1), the I/O terminal block 105a may, in varying embodiments, support fewer or more electronic marshaling components. Additionally, fewer electronic marshaling components could be connected to the I/O terminal block 105a than the I/O terminal block 105a supports. For example, the I/O terminal block 105a may support 16 electronic marshaling components, but at a particular time may be connected to 15, 12, 10, 7, or even 1 electronic marshaling component(s).

Figure 2D:
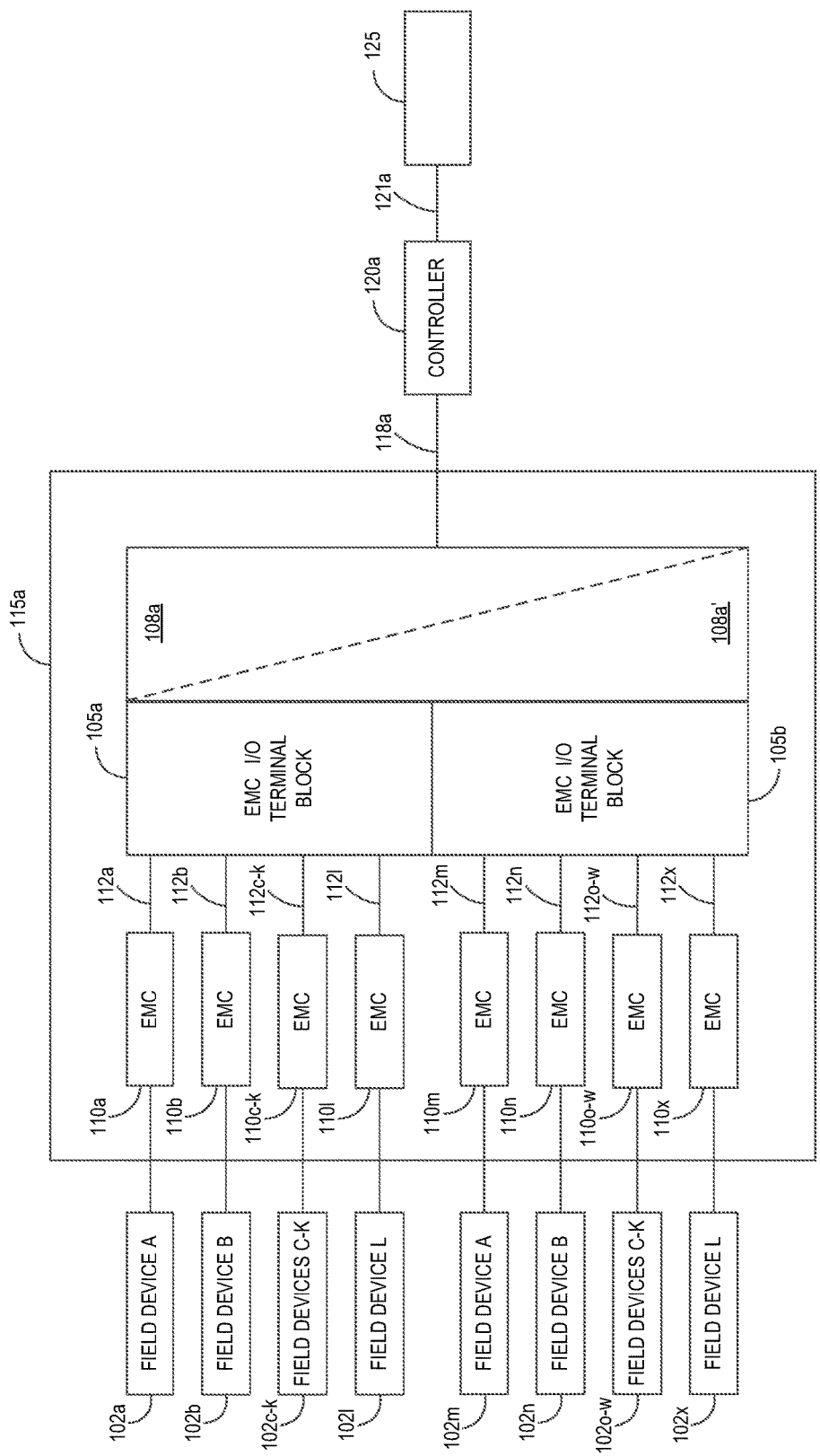
FIG. 2D depicts a block diagram of an another implementation of example loops which may be included in the process plant of FIG. 1 and which may be at least partially commissioned utilizing the distributed marshaling architecture.

FIG. 2D depicts another embodiment. While not immediately apparent from FIG. 2B, each of the I/O card carriers 142 may support multiple ones of the electronic marshaling modules 148 with EMC terminal blocks 150, in order to provide support for additional I/O channels. FIG. 2D depicts a first multiplicity of field devices 102a-102l and a second multiplicity of field devices 102m-102x. Each of the field devices 102a-102x is communicatively connected (e.g., in a wired or wireless manner) to a corresponding electronic marshaling component 110a-110x. Each of the electronic marshaling components 110a-110l, corresponding to the first multiplicity of field devices 102a-102l, is communicatively connected 112a-112l to a first I/O terminal block 105a. At the same time, each of the electronic marshaling components 110m-110x, corresponding to the second multiplicity of field devices 102m-102x, is communicatively connected 112m-112x to a second I/O terminal block 105b. Each of the first and second I/O terminal blocks 105a and 105b is, in turn, is communicatively coupled to the redundant I/O cards 108a, 108a'. The redundant I/O-cards 108a, 108a' are communicatively connected 118a to the controller 120a, which, in turn, is communicatively connected 121a to the back-end environment 125 of the process plant 5. The electronic marshaling components 110a-x, the I/O terminal blocks 105a and 105b, and the redundant I/O cards 108a, 108a' may all be enclosed in the cabinet 115a. While in the embodiment depicted in FIG. 2D, each of the I/O terminal blocks 105a and 105b supports 12 electronic marshaling components (e.g., 110a-1), the I/O terminal blocks 105a and 105b may, in varying embodiments, support fewer or more electronic marshaling components, as was the case in the embodiment depicted in FIG. 2C.

Additionally, while FIG. 2D depicts two I/O terminal blocks 105a and 105b coupled to a pair of redundant I/O cards 108a, 108a', in various embodiments, each I/O card (and thus, each pair of redundant I/O cards) may support fewer or more I/O terminal blocks and/or fewer or more total I/O channels. For example, in a particular embodiment, each I/O card 108 supports a total of up to 96 I/O channels, which corresponds to eight I/O terminal blocks 105 if each terminal block supports 12 electronic marshaling components 110.

Figure 2E:
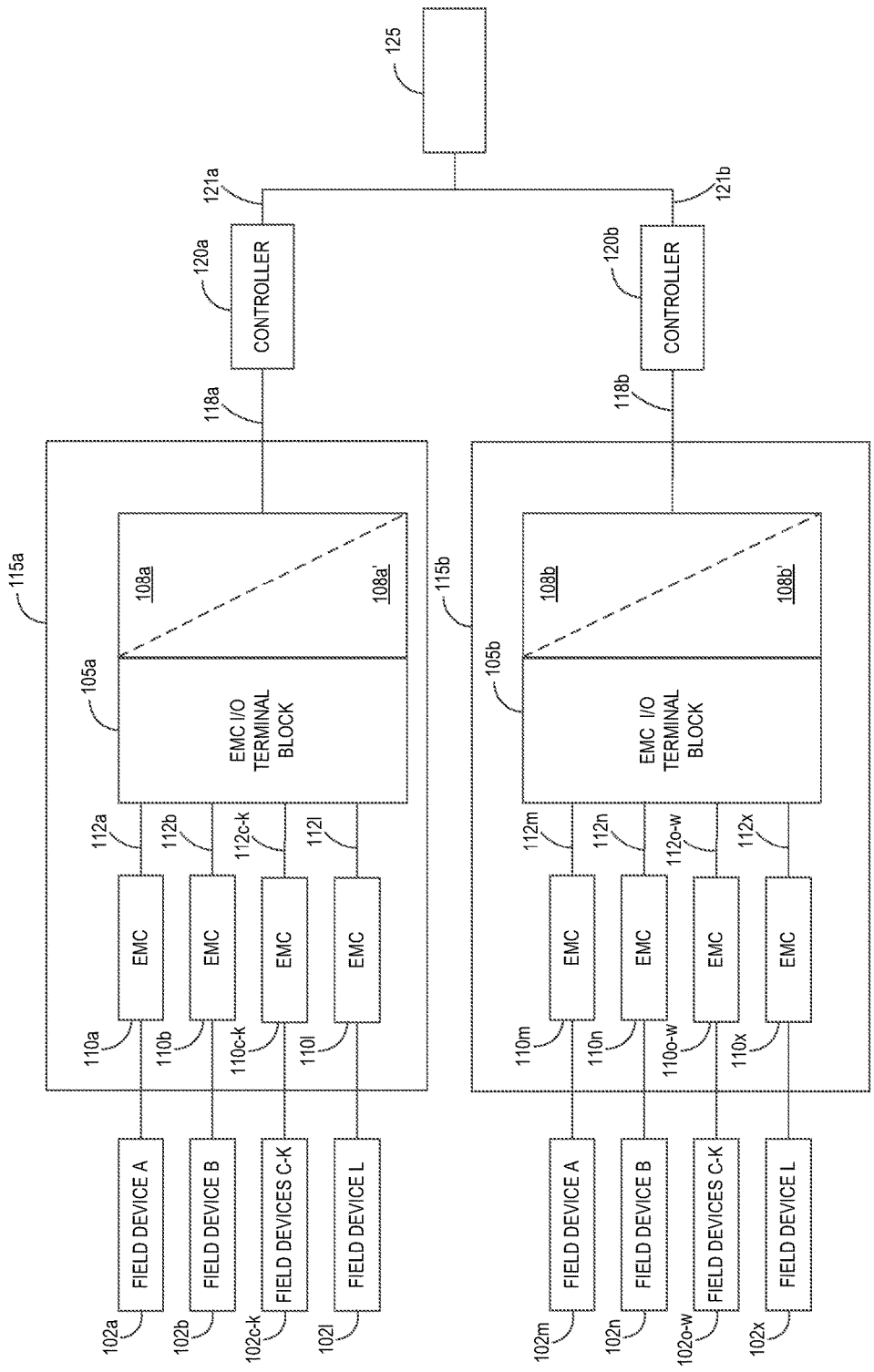
FIG. 2E depicts a block diagram of still another implementation of example loops which may be included in the process plant of FIG. 1 and which may be at least partially commissioned utilizing the distributed marshaling architecture.

FIG. 2E depicts yet another embodiment, this one illustrating the communicative connection between field devices and multiple controllers. FIG. 2E depicts the first multiplicity of field devices 102a-102l and the second multiplicity of field devices 102m-102x. As in each of FIGS. 2C and 2D, each of the field devices 102a-102x is communicatively connected (e.g., in a wired or wireless manner) to a corresponding electronic marshaling component 110a-110x. However, in the embodiment depicted in FIG. 2E, each of the electronic marshaling components 110a-110l, corresponding to the first multiplicity of field devices 102a-102l, is communicatively connected 112a-112l to a first I/O terminal block 105a that, in turn, is communicatively connected to the first pair of redundant I/O cards 108a, 108a'. At the same time, each of the electronic marshaling components 110m-110x, corresponding to the second multiplicity of field devices 102m-102x, is communicatively connected 112m-112x to the second I/O terminal block 105b that, in turn, is communicatively connected to a second pair of redundant I/O cards 108b, 108b'. The redundant I/O-cards 108a, 108a' are communicatively connected 118a to the controller 120a, while the redundant I/O cards 108b, 108b' are communicatively connected 118b to a controller 120b. The controllers 120a, 120b are, in turn, communicatively connected 121a, 121b to the back-end environment 125 of the process plant 5. As depicted, the first multiplicity of electronic marshaling components 110a-110l, the I/O terminal block 105a, and the redundant I/O cards 108a, 108a' are enclosed in the cabinet 115a, while the second multiplicity of electronic marshaling components 110m-110x, the I/O terminal block 105b, and the redundant I/O cards 108b, 108b' are enclosed in a cabinet 115b. Of course, it will be appreciated that the contents depicted in cabinets 115a and 115b may, in some embodiments, be in a single cabinet.

Figure 2F:
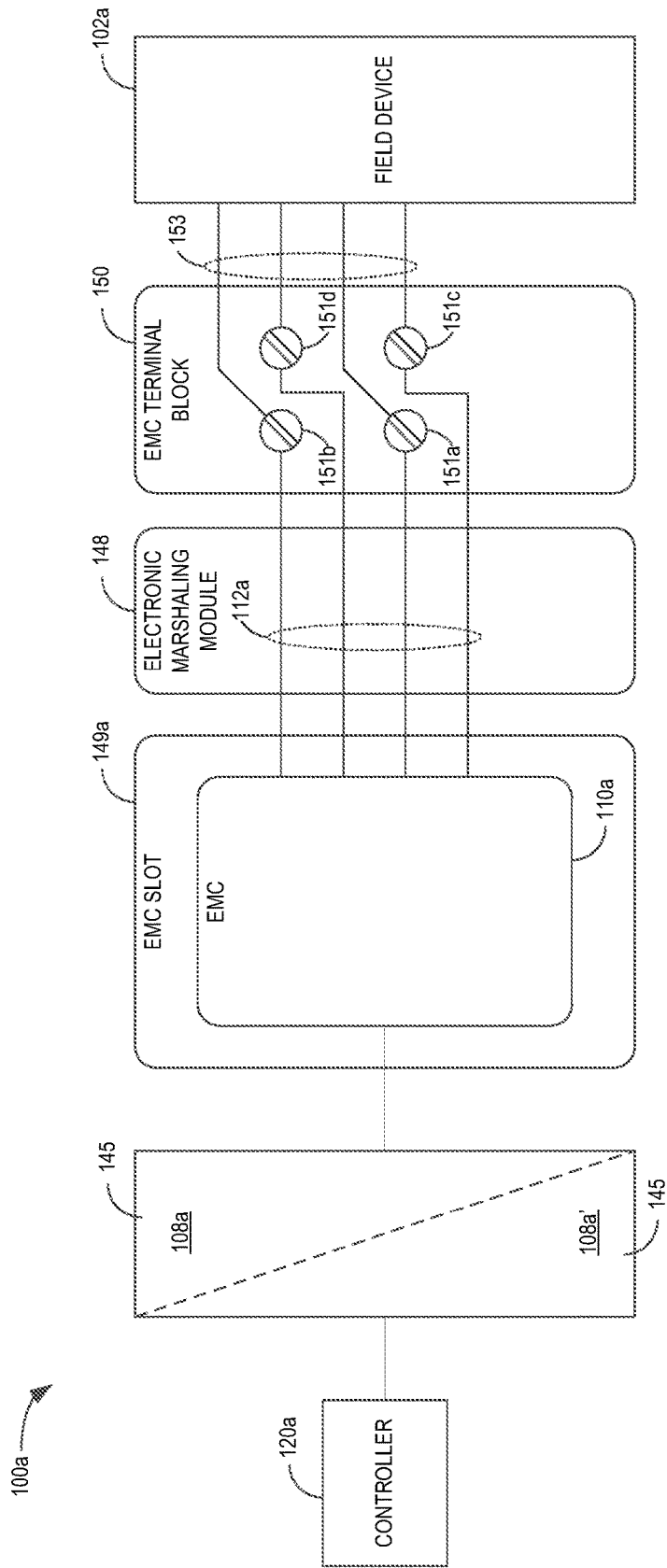
FIG. 2F depicts a block diagram depicting the connections various elements of a control loop implementing the distributed marshaling architecture.

Turning now to FIG. 2F, the control loop 100a (see FIG. 2A) is depicted in greater detail, illustrating a particular benefit during configuration and commissioning of the process plant 5. With reference briefly to FIG. 2B, the EMC terminal block 150 includes, for each channel on the electronic marshaling module 148, a set of terminals 151a-151d. Though illustrated as including four terminals 151a-151d, each channel of the EMC terminal block 150 may include two or three terminals in other embodiments. In the embodiment illustrated in FIG. 2F, each channel of the EMC terminal block 150 includes four terminals 151a-151d, so that each channel may support devices having one, two, three, or four-wire connections to its respective field device 102a.

The field device 102a is coupled to some or all of the terminals 151a-151d by a wire run 153, that originates at the field device 102a and terminates at the terminals 151a-151d. In embodiments, the wire run 153 may be several, tens, or even hundreds of feet long, depending on the location of the field device 102a relative to the cabinet 115a, the type of signals carried by the wire run 153, the specific path of the wire run 153 around the process plant 5, etc. In some embodiments, the wire run 153 may be between a receiver receiving signals from the field device 102a (or from a multiplicity of field devices) and the terminals 151a-151d.

As will be understood, the number of wires that terminate at the terminals 151a-151d of a given channel will depend upon the type of field device coupled to the terminals 151a-151d, as well as on the transmission protocol implemented by the field device 102a and on the signal type. A defining characteristic of process plants that implement the EMC architecture (i.e., that use EMC I/O cards, EMCs, etc.) is that the field devices coupled to the EMC I/O cards may be coupled to any channel on the EMC terminal block 150 without regard to the type of signal being communicated, via the I/O card and the EMC, between the controller and the field device. This is because the EMC functions to convert the signal on the field device side to a signal that can be communicated to the controller, and vice versa. This is in contrast with previous architectures in which each I/O card had channels dedicated to particular types of signals, requiring the field devices to be wired to the terminals corresponding to the correct channels on the I/O card.

Referring again to FIG. 2F, the signals on the various wires of the wiring run 153 are passed via connections (e.g., the connection 112a in previous figures) to the EMC 110a by the electronic marshaling module 148. That is, the electronic marshaling module 148 serves as a backplane connection between the terminals 151*a*-151*d* on the EMC terminal block 150 and the EMC 110*a* inserted into the EMC slot 149*a*. The EMC 110*a* is selected according to the signals that will be transmitted on the wiring run 153 that terminates at the corresponding set of terminals 151*a*-151*d*. For instance, if the field device 102*a* is sending signals that represent an Analog Input (AI), then the EMC 110*a* selected to be inserted into the corresponding EMC slot 149*a* would be an AI EMC, and would convert the analog signal (e.g., 4-20 mA) to a corresponding digital signal for the I/O card 108*a* to communicate to the controller 120*a*. As another example, if the field device 102*a* is receiving a Discrete Output (DO) signal from the controller 120*a*, then the EMC 110*a* selected to be inserted into the corresponding EMC slot 149*a* would be a DO EMC. The EMC 110*a* is configured to convert the signals received at the terminals 151*a*-151*d* to signals that can be passed to the controller 120*a* by the I/O card 108, and/or to convert the signals received from the controller 120*a* via the I/O card 108 to signals that can be passed to the field device 102*a* across the wiring run 153.

Figure 2G:
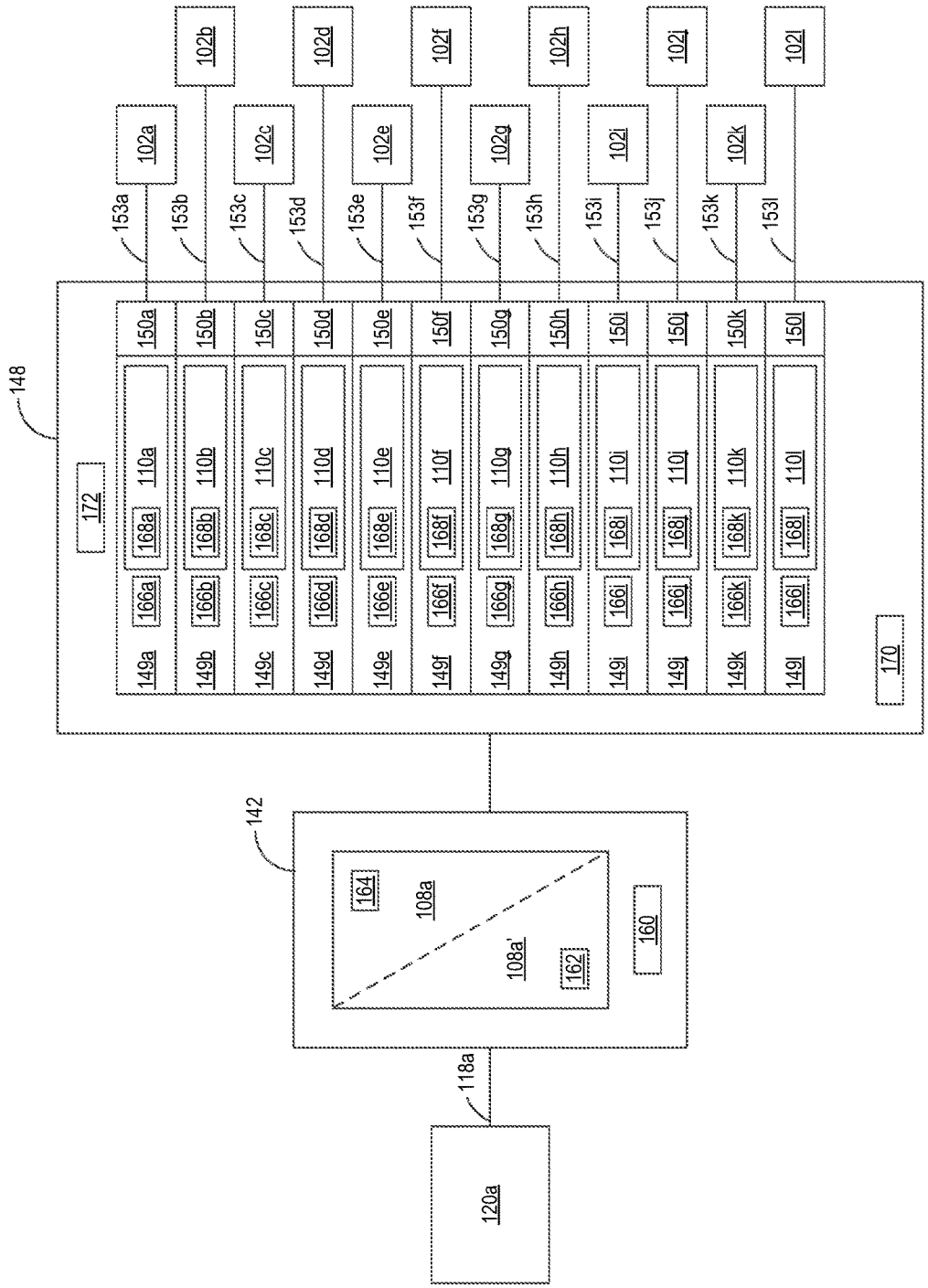
FIG. 2G is a block diagram illustrating several possible embodiments of a distributed marshaling architecture.

FIG. 2G is a block diagram for the purposes of illustrating and describing several possible embodiments. In FIG. 2G, 12 field devices 102*a*-102*l* are each coupled by respective wire runs 153*a*-153*l* to respective terminals 150*a*-150*l* on an electronic marshaling module 148. The electronic marshaling module 148 communicatively connects, as a backplane, the terminals 150*a*-150*l* (and the field devices 102*a*-102*l* communicatively connected to them) to respective EMC slots 149*a*-149*l*. Each of the EMC slots 149*a*-149*l* is populated with a respective EMC 110*a*-110*l*, selected according to the signals being communicated to/from its respective field device 102*a*-102*l*. The electronic marshaling module 148 is communicatively connected to an I/O card carrier 142, such that each of the channels corresponding to the EMC slots 149*a*-149*l* is communicatively connected to a respective channel on each of a pair of redundant I/O cards 108*a*, 108*a*' populating the I/O card carrier 142. The I/O card carrier 142 is coupled to a controller 120*a* via a connection 118*a*, thereby providing a communicative connection between the controller 120*a* and each of the redundant I/O cards 108*a*, 108*a*'.

FIG. 2G also depicts several memory devices at various locations between the controller 120*a* and the field devices 102*a*-102*l*. Each of the several memory devices represents a possible location where data could be stored when received from the field devices 102*a*-102*l* before being sent to the controller 120*a*, or when received from the controller 120*a* before being sent to the field devices 102*a*-102*l*. In an embodiment, data received from each of the field devices 102*a*-102*l* is transmitted to the respective EMCs 110*a*-110*l*, and directly to the redundant I/O cards 108*a*, 108*a*', where it is stored until needed (e.g., until requested by the controller 120*a*, or until an assigned time slot during which the data on a particular channel are to be transmitted to the controller 120*a*) on memory devices 164 and 162, respectively. In another embodiment, data received from each of the field devices 102*a*-102*l* is transmitted to the respective EMCs 110*a*-110*l*, and directly to a memory device 160 disposed on or in the I/O card carrier 142, where it is stored until needed (e.g., until requested by the controller 120*a*, or until an assigned time slot during which the data on a particular channel are to be transmitted to the controller 120*a*) and then retrieved by the redundant I/O cards 108*a*, 108*a*' and transmitted to the controller 120*a*. In still another embodiment, data received from each of the field devices 102*a*-102*l* is transmitted to the respective EMCs 110*a*-110*l*, and stored in respective memory devices 166*a*-166*l* disposed in or associated with the EMC slots 149*a*-149*l*. The data may be stored in the memory devices 166*a*-166*l* until the redundant I/O cards 108*a*, 108*a*' retrieve the data for transmission to the controller 120*a*. In a fourth embodiment, data received from each of the field devices 102*a*-102*l* is transmitted to the respective EMCs 110*a*-110*l*, and stored in respective memory devices 168*a*-168*l* disposed within the EMCs 110*a*-110*l*. The data may be stored in the memory devices 168*a*-168*l* until the redundant I/O cards 108*a*, 108*a*' retrieve the data for transmission to the controller 120*a*. In yet another embodiment, data received from each of the field devices 102*a*-102*l* is transmitted to the respective EMCs 110*a*-110*l*, and stored in a memory device 170 disposed in the electronic marshaling module 148. The data may be stored in the memory device 170 until the redundant I/O cards 108*a*, 108*a*' retrieve the data for transmission to the controller 120*a*.

Of course, in various embodiments, the memory devices 160, 162, 164, 166*a*-166*l*, 168*a*-168*l*, and/or 170 may be used in combination, with data being stored in multiple places. Additionally, in embodiments, the data may be updated in the memory or memories more or less frequently than the data are transmitted to the controller 120*a*. That is, while the memory or memories may be storing only a single value for each parameter at a given time, the value may be retrieved more frequently than it is updated, or may be updated multiple times before it is retrieved.

In still other embodiments, a scanning module 172 operates on the electronic marshaling module 148 to scan repeatedly (e.g., periodically) each of the populated EMC slots 149*a*-149*l* and to store the data from each of the EMCs 110*a*-110*l* in the populated EMC slots 149*a*-149*l* to one or more of the memory devices and, for example, the memory devices 170, 160, 162, and/or 164. The scanning module may be, for instance, a multiplexing device scanning the values presently output by each of the EMCs 110*a*-110*l* at any given point. Alternatively, the scanning module 172 may be scanning the memory devices associated with the EMCs 110*a*-110*l*, such as the memory devices 166*a*-166*l*, or the memory devices 168*a*-168*l*. Simply put, the scanning module 172 may be implemented to scan the data output directly by the EMCs 110*a*-110*l*, or may be implemented to scan the data stored in a set of memory devices.

FIGS. 3 through 6 illustrate the distributed marshaling features of the process plant 5 that provide a number of additional advantages when implemented in the process plant 5. Specifically, while some portions of the process plant 5 may include centralized marshaling cabinets as described with respect to FIGS. 2A to 2G (e.g., the cabinet 115*a* depicted in FIG. 2A), in which a marshaling block 140, includes one or more I/O card carriers 142 each coupled to one or more electronic marshaling modules 148 with respective EMCs 152, the presently described process plant 5 may also include distributed EMC networks that do not centralize all of the components of the marshaling block 140 in a single cabinet or location. Instead, the I/O card carrier 142 may be located in one place (e.g., in the marshaling cabinet 115*a*), while EMCs 152 and supporting architecture (as will be described) may be remotely located from the I/O card carrier 142 and distributed throughout the field environment 122 of the process plant 5.

As will be evident from the description to follow, the benefits of such an arrangement include: shorter wiring runs between the field devices and the terminal blocks; smaller power requirements in each location; lower heat dissipation requirements in each location; greater redundancy for communications; and others.

Figure 3:
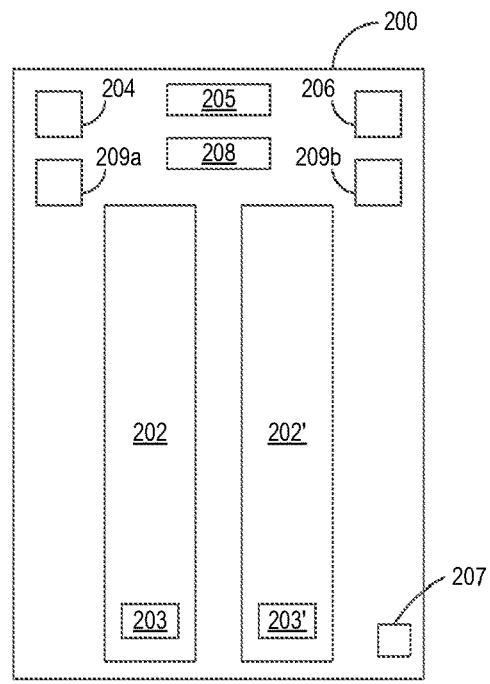
FIG. 3 depicts a block diagram of an I/O head-end in accordance with an embodiment of a distributed marshaling architecture.

FIG. 3 depicts a block diagram of a I/O head-end 200 in such a distributed system. The head-end 200 performs many of the same functions as the I/O card carrier 142 depicted in FIG. 2B, namely, the head-end 200 carries (and is communicatively connected to) a pair of redundant I/O cards 202, 202' that communicate both with field devices and with one or more controllers, as described above. Each of the I/O cards 202, 202' may include a respective memory device 203, 203' that may store computer-readable instructions for operating the I/O cards 202, 202', and/or may temporarily store data being communicated to one or more field devices from a controller, or to a controller from one or more field devices. Additionally, or alternatively, a memory device 208 may store computer-readable instructions for operating the I/O cards 202, 202', for coordinating redundancy between the I/O cards 202, 202', for coordinating communications between the head-end 200 and other devices connected thereto (as described below) and/or may temporarily store (e.g., in a database) data being communicated to one or more field devices from a controller, or to a controller from one or more field devices. Lastly, a processor 205 may be coupled to the memory device 208 and may execute the computer-readable instructions stored thereon for the purpose of storing and/or retrieving data from the memory device 208, controlling the I/O cards 202, 202', and communicating via a variety of communication ports.

A communication port 207, for instance, may couple the head-end 200 to the one or more controllers (e.g., to the controller 120a). The communication port 207 may be any suitable communication port implementing any suitable communication protocol but, in an embodiment, is an Ethernet port implementing Ethernet communications. Additional communication ports 204, 206, 209a, and 209b facilitate communication between the head-end 200 and one or more distributed electronic marshaling modules 210 (also referred to herein as "distributed marshaling modules") (see FIG. 4). The communication ports 204 and 206, for instance, may serve primarily as output and input ports, respectively, with the port 204 transmitting data from the head-end 200 to the distributed marshaling modules 210, and the port 206 receiving data at the head-end 200 from the distributed marshaling modules 210, as described below. In embodiments, the ports 209a and 209b may have similar functionality and may service a second set of distributed marshaling modules 210.

Figure 4:
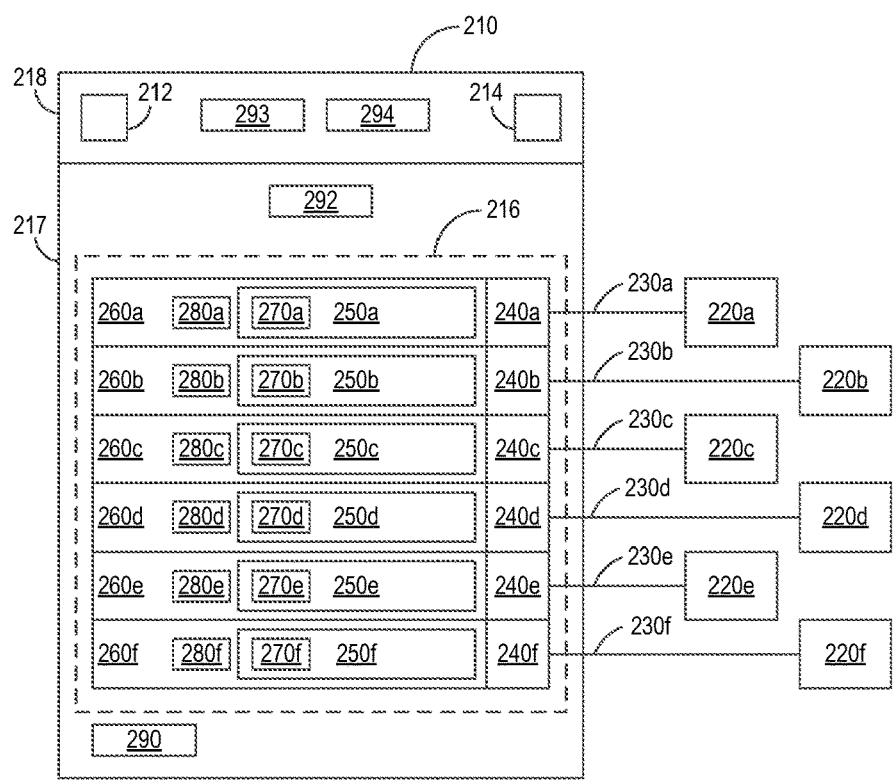
FIG. 4 depicts a block diagram of a distributed marshaling module in accordance with embodiments of a distributed marshaling architecture.

One such distributed marshaling module 210 is depicted in FIG. 4, in block diagram format. The distributed marshaling module 210 is, in many respects, similar to the electronic marshaling module 148 depicted in FIG. 2G, in that it includes a circuitry block 216 that, in turn, includes a multiplicity of EMC slots 260a-260f, and a corresponding multiplicity of terminal blocks 240a-240f. Each of the EMC slots 260a-260f is configured to receive and be communicatively connected to a corresponding EMC 250a-250f. As described above, each of the EMCs 250a-250f may (but need not necessarily) include a corresponding memory device 270a-270f, and/or each of the EMC slots 260a-260f may likewise include (but need not necessarily do so) a corresponding memory device 280a-280f. As should by now be understood, each of the terminal blocks 240a-240f is configured to be communicatively coupled to a corresponding field device 220a-220f by a corresponding wire run (or wireless link) 230a-230f.

The EMCS 250a-250f function in the same was as described above with respect to previous figures. That is, the each of the EMCs 250a-250f is selected according to the signals that will be transmitted on the corresponding wire run 230a-230f between the distributed marshaling module 210 and the respective field device 220a-220f. Of course, while the distributed marshaling module 210 is depicted in FIG. 4 as having six EMC slots 260a-260f in the circuitry block 216, the number of EMC slots is but a single example embodiment, and a particular distributed marshaling module 210 may include a circuitry block 216 having any selected number of EMC slots including, for example, 2, 4, 6, 8, 10, 16, etc. Additionally, while the distributed marshaling module 210 is depicted in FIG. 4 as having a single circuitry block 216, in embodiments the distributed marshaling module 210 is operable to support multiple circuitry blocks 216. In some embodiments, the circuitry block 216 is modular, and multiple circuitry blocks 216, each disposed on a circuitry module card 217 or coupled together on a single circuitry module card 217, can be communicatively coupled to one another by a connector (not shown), and may be supported/serviced by a single distributed marshaling module 210.

In addition to the circuitry block 216, the distributed marshaling module 210 and, in particular, a communication module 218, may include a pair of communication ports 212 and 214. In embodiments, the communication ports 212, 214 may be Ethernet communication ports configured to communicate via an Ethernet protocol. Generally, however, the communication ports 212, 214 may operate using any communication protocol and medium, known or developed in the future, suitable for providing secure, timely, error-free network communication between the distributed marshaling module 210 and I/O cards 203, 203'. In embodiments, while both ports 212, 214 are operable to provide bi-directional communication, each port may be primarily dedicated particularly to the transmit or receive functions.

Further, the distributed marshaling module 210 may include a scanning module 292 that is operable to scan the multiplicity of EMCs 250a-250f. The scanning module 292 may be disposed on the circuitry module card 217, with each circuitry block 216 having a dedicated scanning module 292, or may be shared among a plurality connected circuitry blocks 216. In any event, the EMCs 250a-250 may be scanned periodically (e.g., using a multiplexer) to retrieve data or values from and/or transmit data or values to each of the field devices 220a-220b. Data retrieved by the scanning module(s) 292 may be transmitted immediately to a head-end 200 via the communication ports (described below) or may be stored temporarily in a memory device 290 until being transmitted to the head-end 200, which may occur periodically, upon request, or some combination of periodically and by request according to pre-programmed functionality. For instance, some values (e.g., a value received at the EMC 250a from the field device 220a) may be required to be transmitted periodically (e.g, every second), while some values (e.g., a value received at the EMC 250b from the field device 220b) may be required to be transmitted immediately upon a change in the value.

The operation of the scanning module 292 and the storage and/or transmission of the values retrieved from the EMCs 250a-250f may be coordinated by a dedicated processor 293. The processor 293 may cooperate with a memory device 294 storing machine readable instructions for operating of the scanning module 292 and directing the transmission to the head-end 200 of data received from the EMCs 250a-250f and/or the transmission to the field devices 220a-220f of data received from the head-end 200. The processor 293 may also be responsible for generating, transmitting, and receiving various "heartbeat" signals (described below), and coordinating the transmission and receipt of data via the pair of communication ports 212, 214 disposed on the distributed marshaling module 210. In some embodiments, the microprocessor 293 may be configured to perform the functions of the scanning module 292, thereby negating the need for a separate scanning module 292. Accordingly, in such embodiments, the scanning module 292 may be omitted.

While various memory devices 270a-270f, 280a-280f, 290, and 294 are described, it should be understood that not all of these devices are required in a given embodiment. Rather, the various memory devices are representative of the variety of locations in which memory devices may be disposed, while accomplishing the goals and functions of the system (i.e., caching data where necessary, storing data, storing computer-readable instructions that cause the processor to control the operation of the distributed marshaling module 210, etc.). Received or transmitted data may be cached or stored in any (or a combination) of the memory devices 270a-270f, 280a-280f, 290, and 294. At the same time, while the processor 293 is described as cooperating with the memory device 294, and the memory device 294 storing the machine-readable instructions executed by the processor 293, the processor 293 may, alternatively or additionally, cooperate with the memory device 290. Moreover, in embodiments, the processor device 293 may be disposed on one or more of the circuitry module cards 217, rather than on the communication module 218 of the distributed marshaling module 210.

Figure 5:
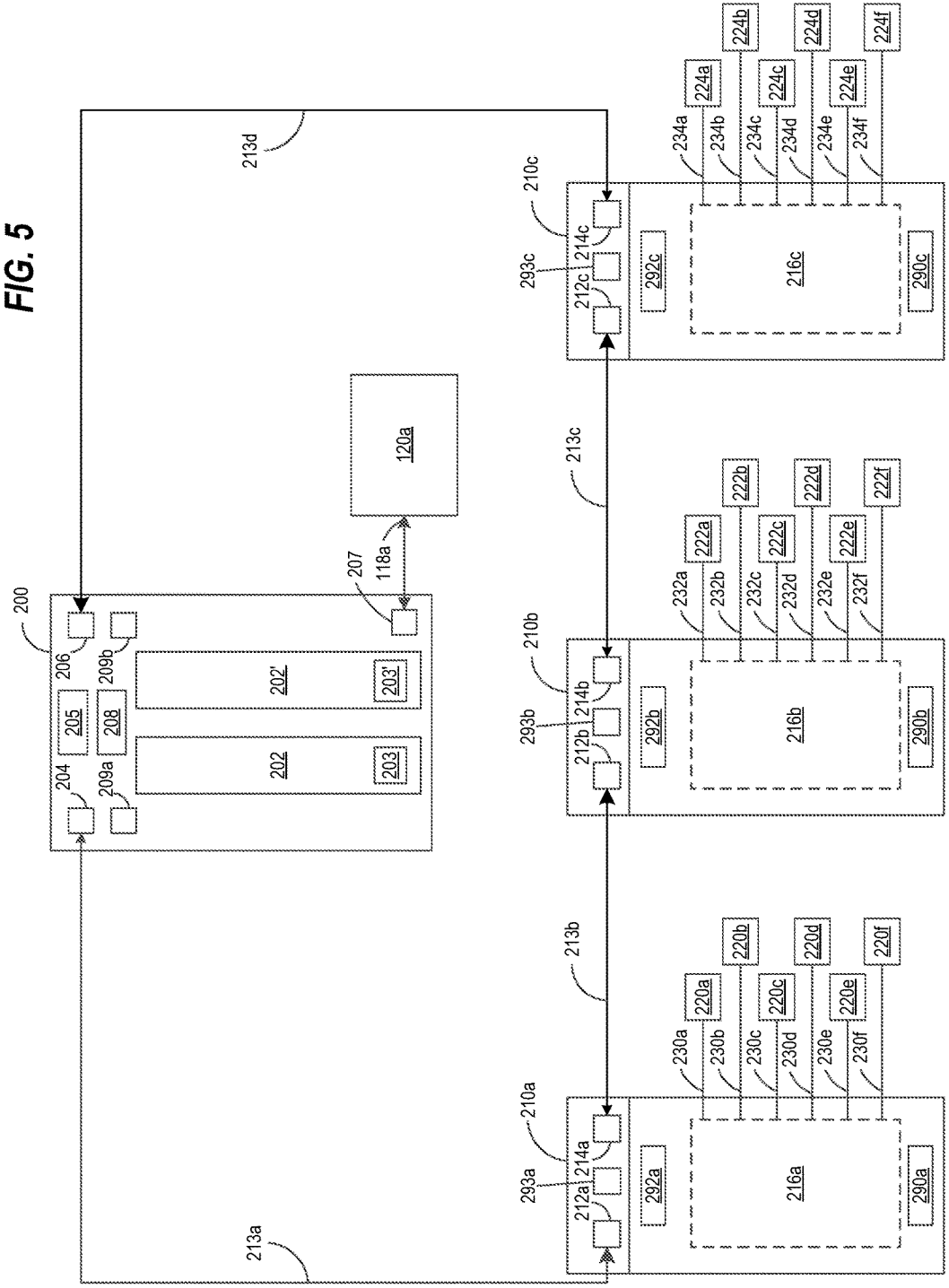
FIG. 5 depicts an example distributed marshaling architecture that may be implemented within the process control system of FIG. 1.

The head-end 200 may cooperate with one or more of the distributed marshaling modules 210 to facilitate a distributed marshaling architecture 201, as depicted in FIG. 5. FIG. 5 depicts the head-end 200 communicatively connected via the communication port 207 to the controller 120a via the communication link 118a, which may be an Ethernet connection, for example. A communication link 213a (which may be an Ethernet connection) communicatively couples the communication port 204 of the head-end 200 to a first communication port 212a of a first distributed marshaling module 210a. The distributed marshaling module 210a includes a circuitry block 216a, to which six field devices 220a-220f are coupled via respective wire runs 230a-230f. Each of the wire runs 230a-230f terminates at a respective terminal, as described above, coupled to a respective EMC slot containing an EMC selected according to the signal format of the respective field device. The distributed marshaling module 210a also includes a scanning module 292a, a memory device 290a, and a processor 293a.

A second communication port 214a of the distributed marshaling module 210a is communicatively coupled via a connection 213b (which may be an Ethernet connection) to a first communication port 212b of a second distributed marshaling module 210b. The distributed marshaling module 210b, like the distributed marshaling module 210a, includes a circuitry block 216b, to which six field devices 222a-222f are coupled via respective wire runs 232a-232f. Each of the wire runs 232a-232f terminates at a respective terminal, as described above, coupled to a respective EMC slot containing an EMC selected according to the signal format of the respective field device. The distributed marshaling module 210b also includes a scanning module 292b, a memory device 290b, and a processor 293b.

FIG. 5 also depicts that a second communication port 214b of the distributed marshaling module 210b is communicatively coupled via a connection 213c (which may be an Ethernet connection) to a first communication port 212c of a third distributed marshaling module 210c. The distributed marshaling module 210c, like the distributed marshaling modules 210a and 210b, includes a circuitry block 216c, to which six field devices 224a-224f are coupled via respective wire runs 234a-234f. Each of the wire runs 234a-234f terminates at a respective terminal, as described above, coupled to a respective EMC slot containing an EMC selected according to the signal format of the respective field device. The distributed marshaling module 210c also includes a scanning module 292c, a memory device 290c, and a processor 293c. A connection 213d communicatively connects a second communication port 214c on the distributed marshaling module 210c to the communication port 206 on the head-end 200.

The communication links/connections 213a-213d, in cooperation with the communication ports 204, 212a-212c, 214a-214c, and 206, form a "ring" architecture, in which data are passed from one device to the next until reaching the intended destination device. In a ring architecture, each communication device (e.g., the distributed marshaling modules 210a-210c, the head-end 200) is communicatively coupled to only two other devices, and each places data onto the communication ring associated with a specified destination device (which may be specified with a destination address or ID), such that the data moves around the communication ring, from device to device, until it reaches its destination. That is, each successive device on the communication ring receives the data, determines whether the corresponding destination corresponds with that device and, if not, forwards the data on to the next successive device on the communication ring. Because each device typically has two ports, one functioning as a "receive" port and one functioning as a "transmit" port, each device is typically connected to only two other devices on the ring.

The flow of data will be described, by way of example, with reference to the distributed marshaling module 210b. The scanning module 292b of the distributed marshaling module 210b may continually, and periodically (e.g., once per second, ten times per second, etc.), scan each of the EMCs associated with the field devices 222a-222f connected to the circuitry block 216b. At any given moment, the signal transmitted by a given one of the field devices 222a-222f (e.g., the field device 222a) is being transmitted from the field device to the associated EMC via the respective wire run (e.g., the wire run 232a). For some signals, the signal is always present on the wire run and may be periodically sampled by the EMC. For other signals, the signal may be transmitted by the field device periodically or upon request, and received at the EMC. Either way, the EMC coupled to each field device may, at any given time, have registered a present or most recent value received from the field device. The scanning module 292b periodically queries each of the EMCs on the distributed marshaling module 210b and then may cache or store the values for each of the EMCs (and each of the field devices) in, for example, the memory device 290b.

The processor 293b may periodically, on a schedule, or upon request by the head-end 200, transmit the values stored in the memory device 290b to the head-end 200. In so doing, the processor 293b may retrieve from the memory device 290b the data to be transmitted, associate a destination device (e.g., the head-end 200) with the data, and transmit the data from the port 214b to the port 212c of the distributed marshaling module 210c via the communication link 213c. The processor 293c on the distributed marshaling module 210c may receive the data via the port 212c, determine that the data are not addressed to the distributed marshaling module 210c (because the data are associated with a destination address indicating the head-end 200) and proceed to transmit the data from the port 214c on the communication link 213d. The data are received at the port 206 by the head-end 200, and the processor 205 may determine that the received data are associated with the address for the head-end 200 and may process the data.

Processing the received data at the head-end 200 may include storing or caching the data for later transmission to the controller 120a via one of the I/O cards 202, 202', or transmitting the data immediately to the controller 120 via one of the I/O cards 202, 202'. Specifically, the head-end 200 may receive all data for all of the EMCs connected to the head-end 200 via the connected distributed marshaling modules 210a-210c, and may store the data in a local database, e.g., in the memory device 208. The head-end 200 may then answer requests, received from a connected controller (e.g., from the controller 120a) for data from specific EMCs, as if each EMC were local to the head-end 200 (e.g., as if the EMCs and I/O cards were configured as in FIG. 2G).

A similar process may be engaged to send data from the controller 120a to a particular field device. For instance, if the controller 120a needs to send data to the field device 222c, the controller 120a may send the data via the I/O card(s) 202, 202' to the head-end 200. The I/O cards 202, 202' may be generally programmed such that each field device is associated with a particular one of the EMCs and may include in the data package the EMC for which the data are destined. The head-end 200 may determine which of the distributed marshaling modules 210a, 210b, 210c is associated with the destination EMC 222c and, upon making the determination, may associate the data with the address of the distributed marshaling module 210b. Thus, if the data are destined for the field device 222c, the data will be associated with the destination address for the distributed marshaling module 210b, before being transmitted from the head-end 200 via the port 204, and being received via the connection 213a at the port 212a of the distributed marshaling module 210a. Upon receipt at the port 212a, the processor 293a may determine that the destination address of the data received on the port 212a is not the same as the destination address of the distributed marshaling module 210a, and may transmit the data on the port 214a. Thereafter, upon receiving the data at the port 212b via the connection 213b, the processor 293b may determine that the destination address of the data received on the port 212b is the same as the destination address of the distributed marshaling module 210b, indicating that the data are destined for an EMC on the distributed marshaling module 210b. The processor 293b may determine from the received data, which EMC the data are destined for, and may place the data on the EMC, where it is transmitted to the field device 222c via the wiring run 232c.

The destination address associated with the data placed on the communication ring may, in various embodiments, be an address associated with the distributed marshaling module or head-end hardware itself, an address of the EMC for which the data are destined, an I/O channel address, or an address (e.g., device tag or device signal tag) of the field device or controller device for which the data are destined. As an example, data placed on the communication ring may be associated with an address of a particular device, such as a field device or a controller—the ultimate device for which the data are destined. In such an embodiment, each distributed marshaling module 210 would keep in its memory device 294 a listing, database, or other such data structure storing the device addresses of the devices coupled to it, such that the processor 293 may compare the address associated with specific data with the addresses to which it has immediate access. If, upon receiving data, the processor 293 finds that the destination address associated with the data matches the address (e.g., the field device tag or data signal tag) of a device attached to the distributed marshaling module 210, then the processor 293 may route the data to that device via the associated EMC. On the other hand, if the processor 293 finds that the destination address associated with the data does not match any of the addresses in the data structure of the memory device 294, the processor 293 may transmit that data to the next device on the communication ring.

As another example, data placed on the communication ring may be associated with an address associated with a specific EMC (i.e., the address of the EMC itself, rather than of the field device coupled to the EMC). In such an embodiment, each distributed marshaling module 210 would keep in its memory device 294 a listing, database, or other such data structure storing the addresses of each of the EMCs populating the EMC slots of the distributed marshaling module, such that the processor 293 may compare the address associated with specific data with the addresses of the local EMCs. If, upon receiving data, the processor 293 finds that the destination address associated with the data matches the address of a local EMC, then the processor 293 may route the data to the EMC, which may communicate the data to the field device coupled to the EMC. On the other hand, if the processor 293 finds that the destination address associated with the data does not match any of the EMC addresses in the data structure of the memory device 294, the processor 293 may transmit that data to the next device on the communication ring.

With regard to data being sent to field devices (e.g., the field device 220a) by a controller (e.g., the controller 120a), the destination address may therefore be associated with the data directly by the controller 120a in embodiments in which the destination address is the device tag or device signal tag associated with the field device. However, in embodiments in which the destination address is an address associated with the EMC to which the field device is coupled, the destination address may associated with the data by, for example, the head-end 200 itself. For instance, the head-end 200 may receive from the controller 120a data destined for a particular field device (e.g., the field device 220a) associated with a device tag for that field device. The head-end 200 may receive the data via the I/O card 202, and may determine that the field device in question (220a) is associated with a particular I/O channel of the I/O card 202. The head-end 200 may then associate the data with a destination address for the EMC (e.g., a tag associated with the EMC itself), or a destination address for a specific distributed marshaling module and channel of the distributed marshaling module corresponding to the EMC (e.g., "module210a-slot0"). Each distributed marshaling module then, upon receiving the data, would examine (in the processor 293) the destination address to determine whether the destination address was associated with the distributed marshaling module.

As described above, data are typically received on one communication port of each of the devices on the communication ring, and transmitted on another communication port of each of the devices on the communication ring, resulting in data flowing generally in one direction on the ring. However, the communication ring and architecture described herein are flexible enough that the data may flow in either direction, providing additional reliability and redundancy. Among its other functions, each of the processors 293a-293c and 205 is programmed (by instructions stored on the memory devices 290a-290c, 208, etc., for example) to generate, transmit, receive, and interpret "heartbeat" signals. The heartbeat signals are periodic (e.g., every 5 ms) signals of a known format or series of bits, that indicate to each device that the next device in the ring (e.g., the device connected to the communication port) is present and operational. That is, each device sends out a periodic heartbeat signal on each of its two ports (on the communication ring), and the adjacent devices receive the heartbeat signal and know that the device from which the signal is received is present and operational. By way of example, the processor 205 sends a heartbeat signal on the port 204 and, upon receiving the heartbeat signal at its port 212a, the processor 293a on the distributed marshaling module 210a can determine that the communication link 213a is operable and coupled to an operable device. The processor 205 also sends a heartbeat signal on the port 206 and, upon receiving the heartbeat signal at its port 214c, the processor 293c on the distributed marshaling module 210c can determine that the communication link 213d is operable and coupled to an operable device. The same behavior holds true for each of the distributed marshaling modules 210a-210c, each processor sends heartbeats to the adjacent devices via the ports 212, 214 and receives from adjacent devices the heartbeats sent by the respective processors of those distributed marshaling modules.

In the event that one of the processors 293a-293c, 205 does not receive a heartbeat signal on one of the two associated communication ports (212a-212c and 214a-214c, or 204 and 206, respectively), the processor in question ceases to transmit data on that port, and both transmits and receives on the other port. Thus, if the processor 293c does not receive a heartbeat signal on the communication port 214c, the processor 293c would transmit data on the port 212c, instead of on the port 214c.

Additionally, each of the processors 293a-293c, 205 may be programmed to reverse the flow of data in the event that it receives data on a communication port typically used for transmitting (i.e., if data are being transmitted the "wrong" direction on the communication ring). Thus, continuing the example above, if the processor 293c transmitted data on the port 212c, the processor 293b of the distributed marshaling module 210b would be programmed, upon receiving data on the port 214b (which generally transmits data) to transmit its data (including data received on the port 214b for which the distributed marshaling module 210b is not the destination) on the port 212b.

Figure 6:
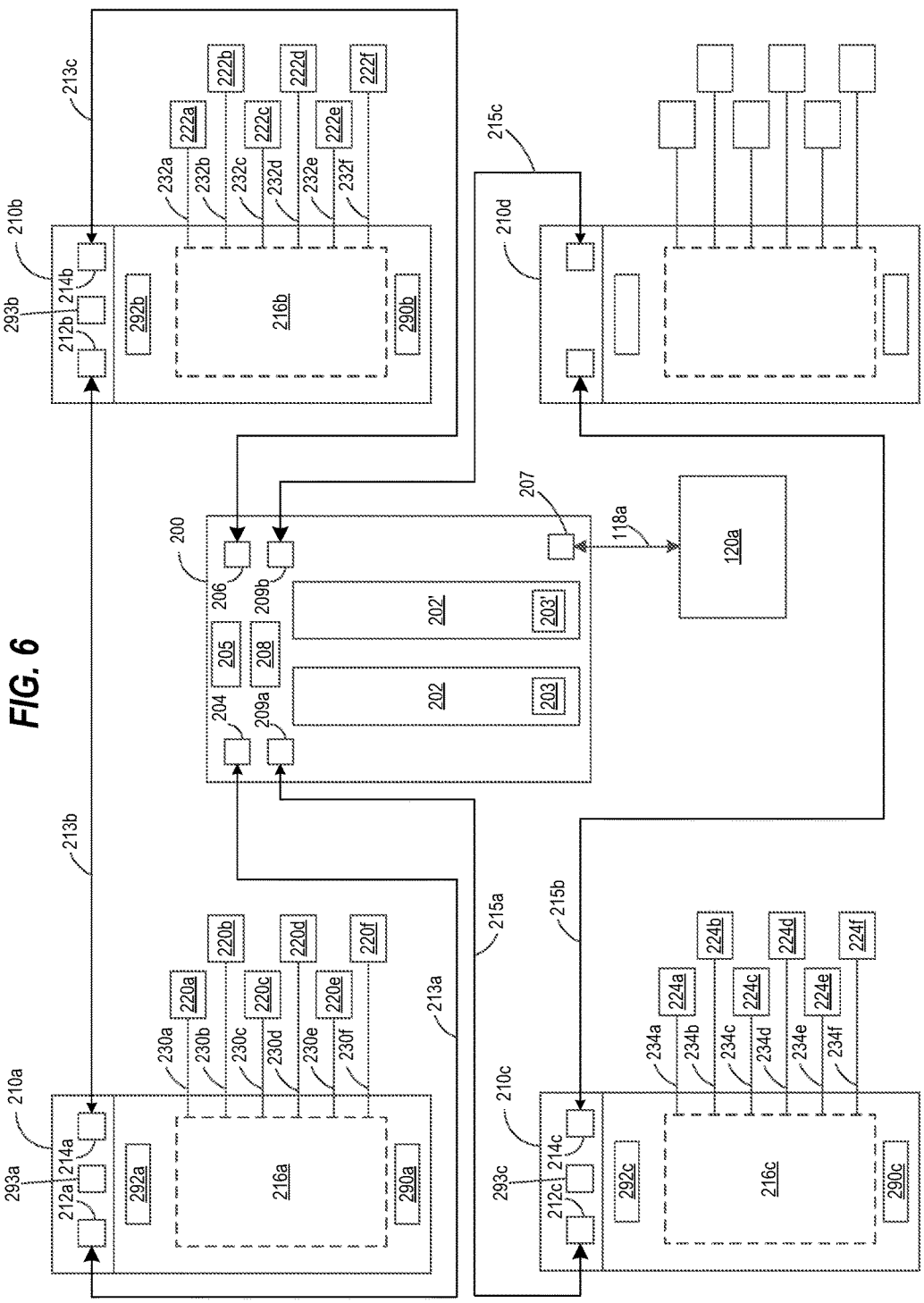
FIG. 6 depicts another example distributed marshaling architecture that may be implemented within the process control system of FIG. 1.

In another embodiment, depicted in FIG. 6, the head-end 200 supports two sets of distributed marshaling modules: a first set of distributed marshaling modules 210a and 210b; and a second set of distributed marshaling modules 210c and 210d. Each set of distributed marshaling modules functions generally as described with respect to FIG. 5, however, in FIG. 6, while the distributed marshaling module 210a and the distributed marshaling module 210b are coupled to the head-end 200 by the ports 204 and 206 of the head-end 200, the distributed marshaling module 210c and the distributed marshaling module 210d are coupled to the head-end 200 by a set of similar ports 209a and 209b. The port 209a functions in much the same way as the port 204, while the port 209b functions in much the same way as the port 206. In this manner, additional flexibility is afforded to the plant engineers designing and configuring the process plant 5, by allowing one distributed EMC ring to service one physical area of the process plant 5, while another distributed EMC ring services another physical area of the process plant 5, yet both distributed EMC rings can be serviced by the head-end 200, the same I/O cards 202, 202', and the same controller 120a.

In the embodiments described with respect to FIGS. 5 and 6, the EMCs in each of the distributed marshaling modules 210a-210d appear to the controller 120a as if each was in the same marshaling cabinet (e.g., the cabinet 115a) adjacent to the I/O card carrier 142. As a result, the embodiments described with respect to FIGS. 3-6, can be implemented in process control systems that already implement an architecture implementing EMCs (e.g., that of FIG. 2A-2G) without requiring any changes to the software of the controller 120a.

Another benefit of the embodiments illustrated in FIGS. 5 and 6 is that EMCs can be moved from a marshaling cabinet (e.g., the cabinet 115a) that is remote from the field devices with which the EMCs are associated, to a distributed marshaling module that is proximate to the field devices, simply by re-landing the wiring run from the field device at the distributed marshaling module and moving the EMC from the marshaling cabinet to the distributed marshaling module. As far as the operation of the controller is concerned, there is no difference.

Figure 7:
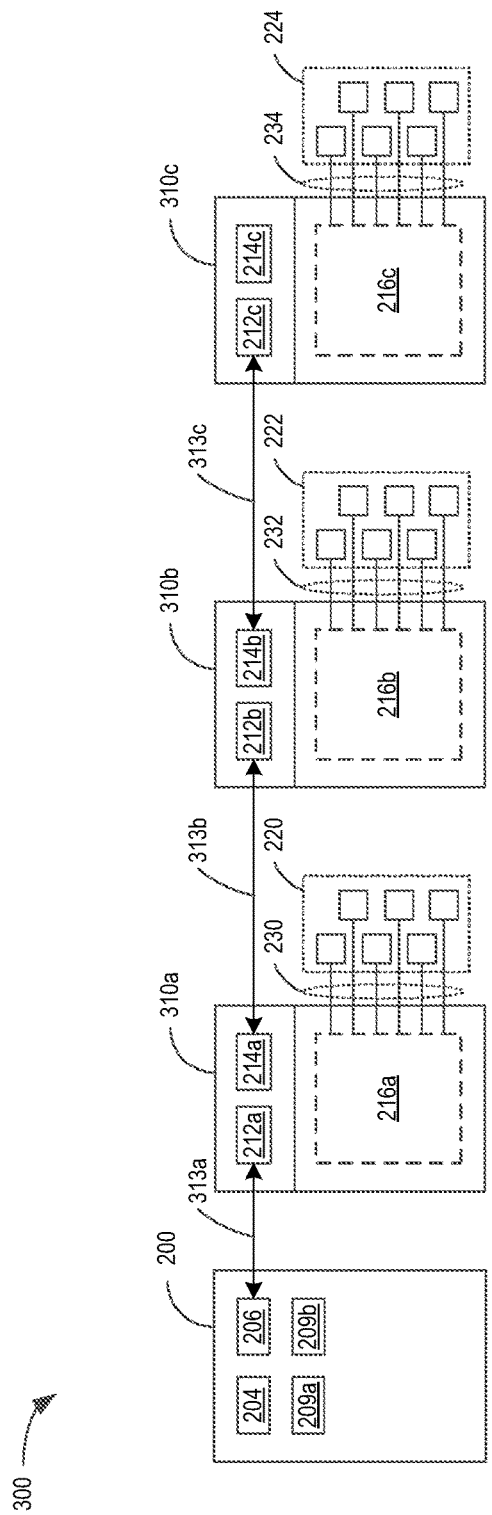
FIG. 7 depicts an still another embodiment of a distributed marshaling architecture that may be implemented; within the process control system of FIG. 1.

While the distributed marshaling system has, until this point, been described as communicating via a ring architecture, it should be understood that the distributed marshaling system, and the components therein, are amenable to other embodiments and configurations as well and, specifically, to other communication architectures. For instance, FIG. 7 depicts an architecture 300 in which a head-end 200 is communicatively connected to each of one or more distributed marshaling modules. While depicted in FIG. 7 as three distributed marshaling modules 310a, 310b, and 310c, the architecture 300 could have any number of distributed marshaling modules, as long as the total number of EMCs populated on those distributed marshaling modules is less than or equal to the number of channels supported by the I/O cards (not shown in FIG. 7) on the head-end 200. Each of the distributed marshaling modules 310a, 310b, and 310c depicted in FIG. 7 includes a respective circuitry block 216a, 216b, and 216c configured to receive and communicate with a set of EMCs (not shown in FIG. 7) that can be coupled by respective wiring runs 230, 232, 234 to sets 220, 222, 224 of field devices.

In contrast to the architecture depicted in FIG. 5, the architecture 300 is not a ring architecture, but generally operates the same way as the ring architecture would operate if the port 204 (in FIG. 5) were not operational. That is, signals are communicated along the communication path, with each distributed marshaling module acting as a bridge for the others. By way of example, data destined for the head-end 200 from the distributed marshaling module 310c would be transmitted to the distributed marshaling module 310b via a communication link 313c between the port 212c and the port 214b. The distributed marshaling module 310b (specifically, the processor thereon) would forward the data over a link 313b between the ports 212b and 214a to the distributed marshaling module 310a. The distributed marshaling module 310a (specifically, the processor thereon) would forward the data over a link 313a between the ports 212a and 206 to the head-end 200. Data flowing the other direction—from the head-end 200 to one of the distributed marshaling modules 310a, 310b, 310c, for example—would move similarly between the various distributed marshaling modules until reaching the destination device.

Figure 8:
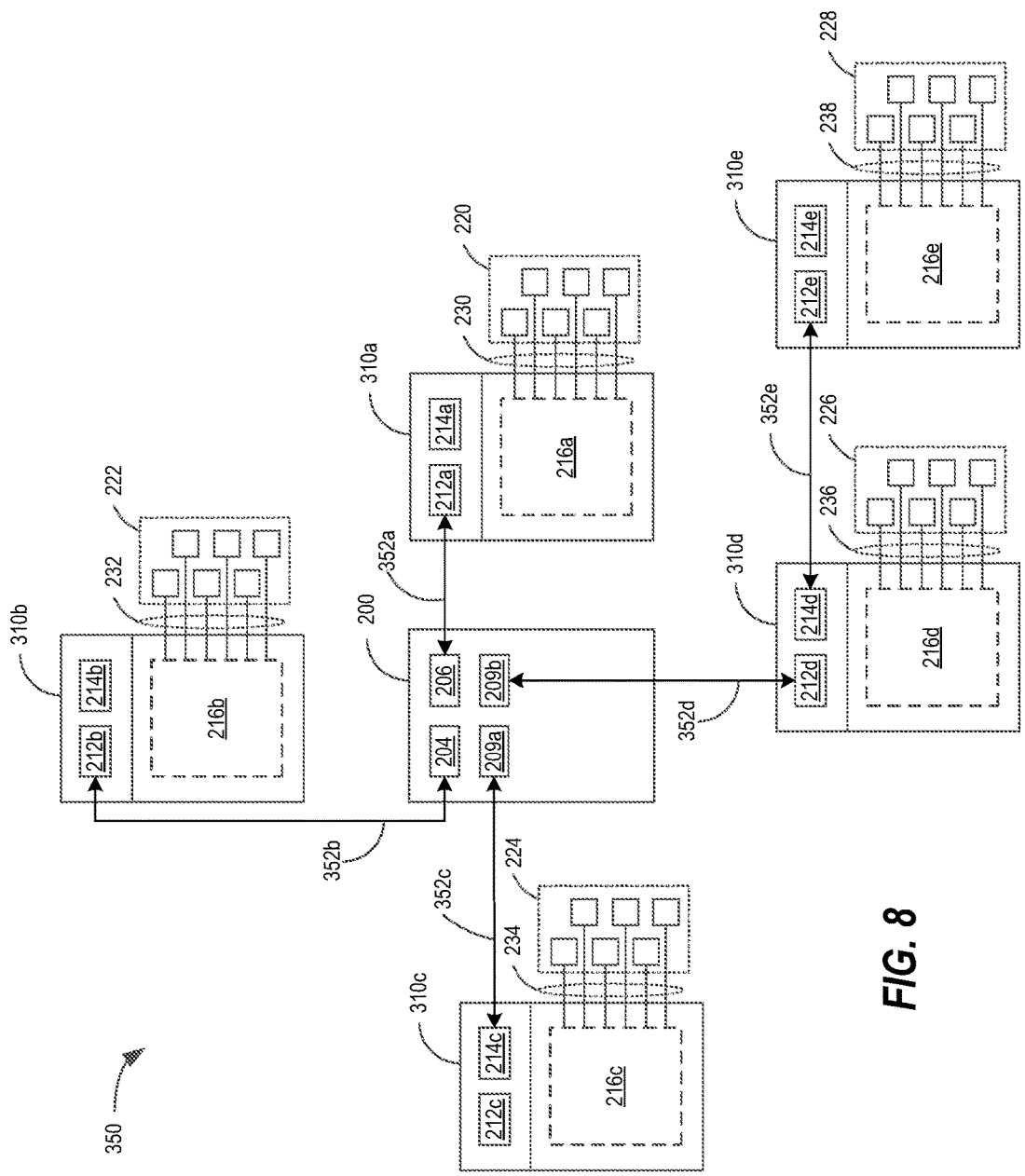
FIG. 8 depicts a further embodiment of a distributed marshaling architecture that may be implemented; within the process control system of FIG. 1.

FIG. 8 depicts another architecture 350 in which a head-end 200 is communicatively connected to each of one or more distributed marshaling modules in a star communication configuration. (It will be understood that if when the head-end is connected to only a single distributed marshaling module, the architectures 300 and 350 are essentially the same.) While depicted in FIG. 8 as five distributed marshaling modules 310a, 310b, 310c, 310d, and 310e, the architecture 350 could have any number of distributed marshaling modules, as long as the total number of EMCs populated on those distributed marshaling modules is less than or equal to the number of channels supported by the I/O cards (not shown in FIG. 8) on the head-end 200. Each of the distributed marshaling modules 310a, 310b, 310c, 310d, and 310e depicted in FIG. 8 includes a respective circuitry block 216a, 216b, 216c, 216d, and 216e configured to receive and communicate with a set of EMCs (not shown in FIG. 8) that can be coupled by respective wiring runs 230, 232, 234, 236, and 238 to sets 220, 222, 224, 226, and 228 of field devices.

Like the architecture 300 of FIG. 7, the architecture 350 is not, per se, a ring architecture. In the architecture 350, each of the distributed marshaling modules 310a, 310b, 310c, and 310d is coupled directly to the head-end 200, via respective ports 206, 204, 209a, and 209b of the head-end 200 coupled to respective ports 212a, 212b, 214c, and 212d. While depicted as having only four communication ports for communicating with distributed marshaling modules, it should be understood that the head-end 200 may have fewer or more ports than depicted, and may support as many distributed marshaling modules as desired, so long as the number of EMCs populated on the distributed marshaling modules is less than or the same as the number of channels supported by the I/O cards.

Additionally, the various configurations may, in some embodiments, be combined. That is, the architecture depicted in FIG. 7, for example, may be combined with the star architecture generally depicted in FIG. 8. FIG. 8 provides an example of such a combination of architectures. In FIG. 8, the distributed marshaling module 310d is communicatively connected to the head-end 200 by a connection 352d between the port 212d of the distributed marshaling module 310d and the port 209b of the head-end 200. However, as illustrated in FIG. 7, the distributed marshaling modules may communicate with other in-line distributed marshaling modules. In this case, a further distributed marshaling module 310e is coupled to the distributed marshaling module 310d by a connection 352e between a port 212e of the distributed marshaling module 310e and the port 214d of the distributed marshaling module 310d. While the distributed marshaling module 310d communicates directly with the head-end 200 (as does each of distributed marshaling modules 310a, 310b, and 310c), in the architecture 350 the distributed marshaling module 310d also communicates data between the distributed marshaling module 310e and the head-end 200.

Figure 9:
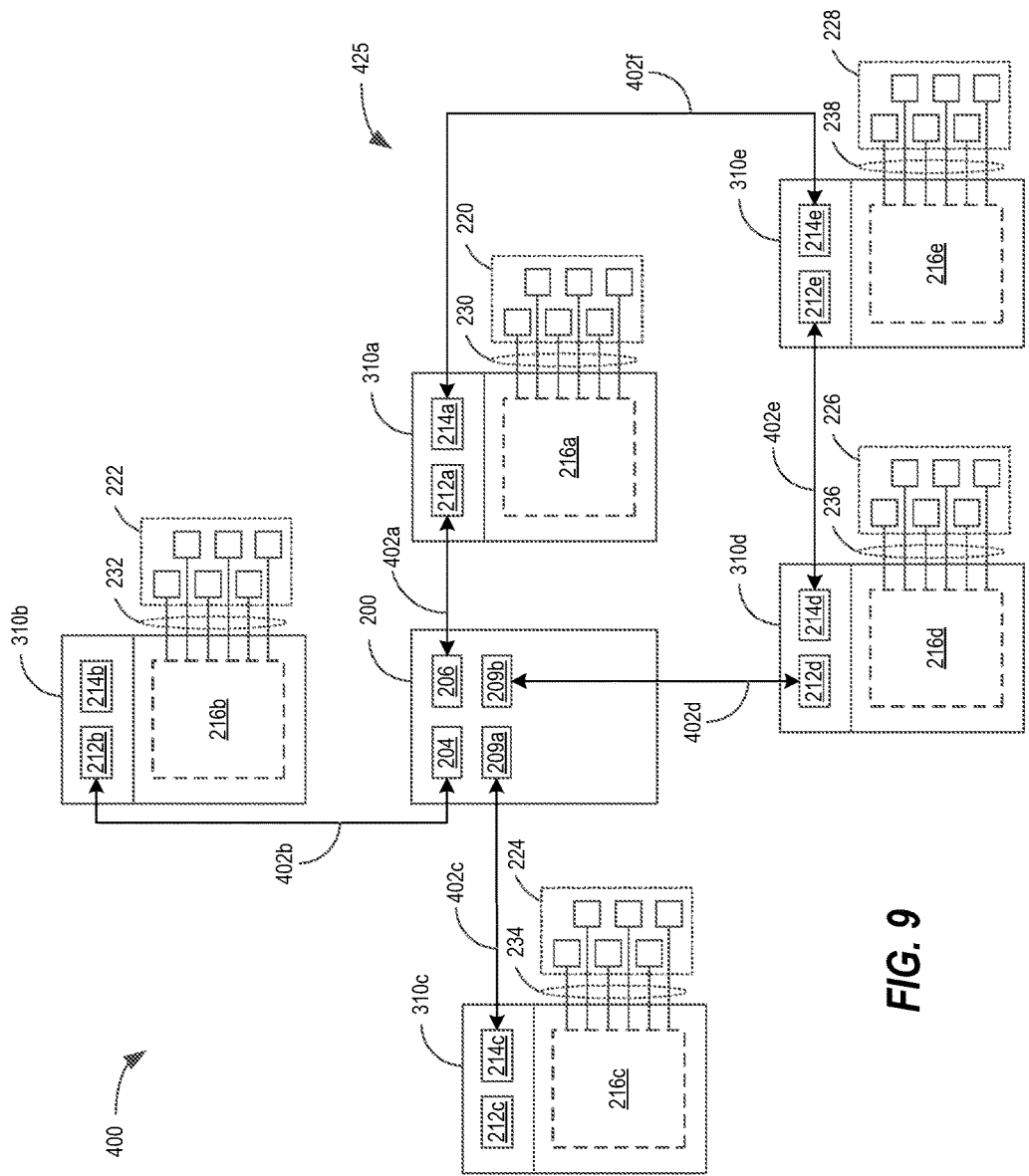
FIG. 9 depicts an yet an additional embodiment of a distributed marshaling architecture that may be implemented; within the process control system of FIG. 1.

FIG. 9 illustrates yet another example architecture 400. In the example architecture 400, the star communication architecture (illustrated in FIG. 8 between distributed marshaling modules 310a, 310b, and 310c and head-end 200) is combined with a ring communication architecture similar to that depicted in FIG. 5. Specifically, the distributed marshaling modules 310a, 310d, and 310e form a communication ring 425 with the head-end 200, with each node (i.e., each of the distributed marshaling modules and the head-end) coupled to exactly two other nodes. The head-end 200 communicates with the distributed marshaling modules 310a, 310d, and 310e on the communication ring 425 via the ports 206 and 209b, in this embodiment. (It should be understood that the selection of ports of the head-end 200 as communicating with particular devices in particular configurations is selectable and, accordingly, there is no requirement that specific pairs of ports cooperate or communicate with specific communication architectures.) A connection 402d between the port 209b and the port 212d couples the head-end 200 to the distributed marshaling module 310d; a connection 402e between the ports 214d and 212e couples the distributed marshaling modules 310d and 310e; a connection 402f between the ports 214e and 214a couples the distributed marshaling modules 310e and 310a; and a connection 402e between the ports 206 and 212a couples the distributed module 310a to the head-end 200. The distributed modules 310a, 31d, and 310e, and the head-end 200, in FIG. 9 communicate in a manner similar to the manner in which the head-end 200 communicates with the distributed marshaling modules 210a, 210b, and 21c in FIG. 5.

In the architectures of FIGS. 7-9—architectures that implement communication paradigms other than the ring architecture—the addressing scheme may differ from that described above with respect to the ring architectures. Because such architectures have only a single path from any distributed marshaling module to the head-end, each of the distributed marshaling modules may be programmed to know which of the pair of communication ports on the distributed marshaling module has a path to the head-end. With reference again to FIG. 7, for example, the distributed marshaling modules 310a, 310b, and 310c may each be programmed to know, for a specific set of distributed marshaling modules and head-end, that data destined for the head-end 200 must be transmitted on ports 212a, 212b, and 212c, respectively. Alternatively, in embodiments, the distributed marshaling modules are configured such that, when the process plant is commissioned, it is imperative that the head-end always be available on one of the ports of each distributed marshaling module and not the other (i.e., that a pre-condition of the architecture is that the head-end be available on the ports 212, and not on the ports 214, or vice versa). In either event, each of the distributed marshaling modules 310a, 310b, and 310c is programmed (specifically, the associated processor is programmed) that data received on a first of the two ports, if not addressed to the distributed marshaling module or to a device (i.e., an EMC or field device) coupled to the distributed marshaling module, is retransmitted on a second of the two ports. In this manner, each distributed marshaling module forwards data down the chain of distributed marshaling modules if the address associated with the data does not correspond to that distributed marshaling module.

The head-end 200, meanwhile, may maintain a database (e.g., in the memory device 208) of address information that permits the head-end 200 to know which field devices, EMCs, and/or distributed marshaling modules are coupled to each of the communication ports of the head-end 200 that is connected to the controller. With reference to FIG. 8, such a database will provide the head-end 200 and, in particular, the processor disposed on the head-end 200, with the necessary information to select one of the ports 204, 206, 209a, or 209b from which to transmit data destined for a given field device, EMC, and/or distributed marshaling module.

In any of the embodiments described explicitly herein, or that will be apparent to those of ordinary skill in the art in view of this specification, it is contemplated that the communication connections between the distributed marshaling modules and the head-end may also supply power to the distributed marshaling modules, to the EMCs populated in the circuitry blocks of the distributed marshaling modules, and even to the field devices connected to the EMCs. Any known method of providing power over a network connection may be implemented, including Power over Ethernet (PoE).

Figure 10:
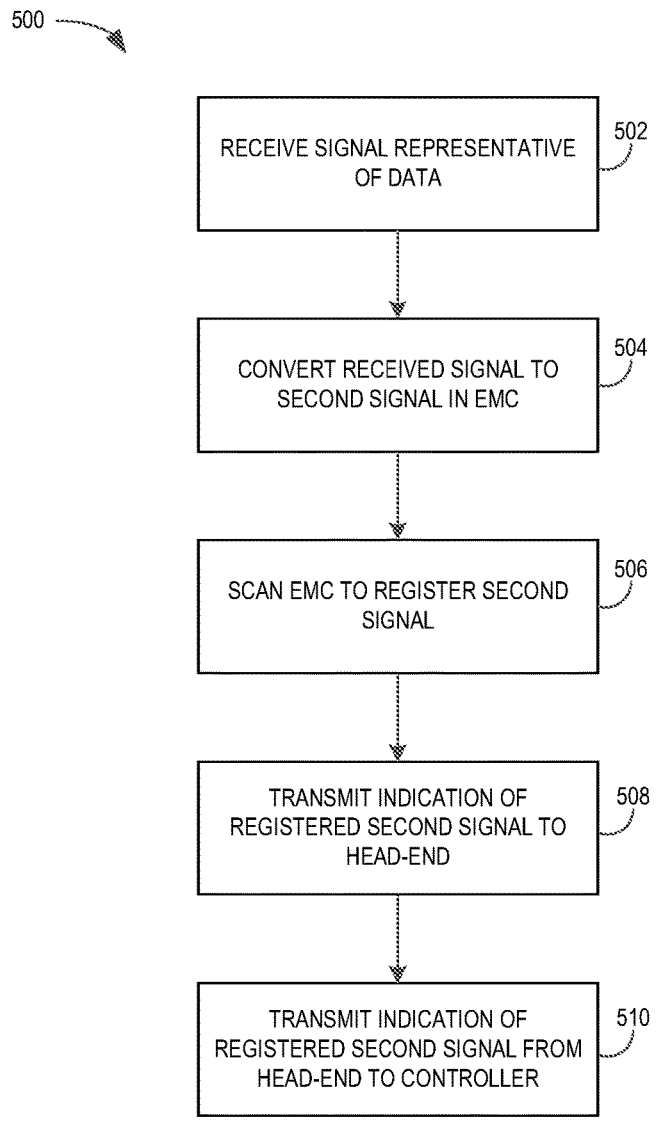
FIG. 10 is a flow diagram depicting a method of communicating data from a field device to a controller in accordance with the described embodiments.

Though a variety of methods will be apparent from the description above, FIG. 10 is a flow diagram depicting one particular method 500 of communicating data from a field device in a process plant to a controller in the process plant. A field device is communicatively coupled, via a wiring run, to a terminal block that is, in turn, communicatively coupled to a distributed marshaling module and, specifically, to an EMC slot populated with an EMC. The EMC may be an AI EMC configured to receive from the field device an analog signal, an AO EMC configured to provide to the field device an analog signal, a DI EMC configured to receive from the field device a discrete input, a DO EMC configured to provide to the field device a discrete signal, or any other type of EMC for interfacing an I/O card to a field device. In any event, a signal representative of the data being communicated is received from the field device at the terminal block (block 502). The EMC converts the signal received from the field device to a second signal that is compatible with an I/O card (block 504). The EMC is scanned to register the second signal (block 506). The microprocessor on the distributed marshaling module transmits a signal indicative of the registered second signal to a head-end module remote from the microprocessor and the EMC (block 508), which in embodiments is communicatively coupled to the controller via an I/O card, via either a first communication port or a second communication port (block 510). In embodiments, the microprocessor transmits the signal indicative of the registered second signal via the first communication port by default, but transmits the signal indicative of the registered second signal via the second communication port if no periodic heartbeat signal is detected on the first communication port within a predetermined period before transmitting. In embodiments, transmitting the signal indicative of the registered second signal includes transmitting the signal indicative of the registered second signal to an intervening distributed marshaling module disposed in the communication path to the head-end module, which communication path may comprise a ring architecture.

Other Considerations

It is noted that while the apparatus, systems, and methods described herein are described with respect to a process control system 5, any one or more of the apparatus, systems, and methods described herein are equally applicable to a process control safety information system of a process control plant, such as the DeltaV SIS™ product provided by Emerson Process Management. For example, a standalone process control safety system or an integrated control and safety system ("ICSS") may be configured using any one or more of the apparatus, systems, and methods described herein.

Additionally, when implemented in software (e.g., computer-readable instructions), any of the applications, services, and engines described herein may be stored in any tangible, non-transitory computer readable memory such as on a magnetic disk, a laser disk, solid state memory device, molecular memory storage device, or other storage medium, in a RAM or ROM of a computer or processor, etc. Although the example systems disclosed herein are disclosed as including, among other components, software and/or firmware executed on hardware, it should be noted that such systems are merely illustrative and should not be considered as limiting. For example, it is contemplated that any or all of these hardware, software, and firmware components could be embodied exclusively in hardware, exclusively in software, or in any combination of hardware and software. Accordingly, while the example systems described herein are described as being implemented in software executed on a processor of one or more computer devices, persons of ordinary skill in the art will readily appreciate that the examples provided are not the only way to implement such systems.

Thus, while the present invention has been described with reference to specific examples, which are intended to be illustrative only and not to be limiting of the invention, it will be apparent to those of ordinary skill in the art that changes, additions or deletions may be made to the disclosed embodiments without departing from the spirit and scope of the invention. Further, although the forgoing text sets forth a detailed description of numerous different embodiments, it should be understood that the scope of the patent is defined by the words of the claims set forth at the end of this patent and their equivalents. The detailed description is to be construed as exemplary only and does not describe every possible embodiment because describing every possible embodiment would be impractical, if not impossible. Numerous alternative embodiments could be implemented, using either current technology or technology developed after the filing date of this patent, which would still fall within the scope of the claims and all equivalents thereof.

The particular features, structures, or characteristics of any specific embodiment may be combined in any suitable manner and in any suitable combination with one or more other embodiments, including the use of selected features without corresponding use of other features. It is to be understood that other variations and modifications of the embodiments of the present disclosure described and illustrated herein are possible in light of the teachings herein and are to be considered part of the spirit and scope of the present disclosure. By way of example, and not limitation, the present disclosure contemplates at least the following aspects:

1. A process control system operating to control a process in a process plant, comprising: a plurality of process control field devices; an input/output (I/O) card communicatively coupled to the plurality of process control field devices; a controller, communicatively coupled to the I/O card and receiving, via the I/O card, data from the plurality of process control field devices, and operating to send, also via the I/O card, control signals to one or more of the process control field devices to control the operation of the process; a distributed marshaling module comprising: a pair of communication ports; one or more electronic marshaling component slots, at least one electronic marshaling component slot having disposed therein an electronic marshaling component; and a respective terminal block corresponding to each of the one or more electronic marshaling component slots, the terminal block for the at least one electronic marshaling component slot being communicatively coupled to one of the plurality of field devices; a microprocessor, coupled to the pair of communication ports; and a head-end module comprising: a first communication port coupling the head-end module to the I/O card; a pair of second communication ports communicatively coupled to the distributed marshaling module; a memory device having stored thereon a database storing information received by the microprocessor via the pair of second communication ports; and a microprocessor, coupled to the memory device, configured to: receive and transmit data via the pair of second communication ports; store received data to the memory device;

retrieve data from the memory device; and transmit retrieved data to the controller via the I/O card.

2. A process control system according to aspect 1, wherein the pair of communication ports on the distributed marshaling module cooperate with the pair of second communication ports on the head-end module to form a ring architecture.

3. A process control system according to either aspect 1 or aspect 2, wherein the microprocessor on the head-end module sends a periodic heartbeat signal on each of the pair of second communication ports and the microprocessor on the distributed marshaling module sends a periodic heartbeat signal on each of the pair of communication ports.

4. A process control system according to any one of the preceding aspects, wherein the process control system comprises a plurality of distributed marshaling modules.

5. A process control system according to any one of the preceding aspects, wherein the electronic marshaling component is configured to receive a signal from the one of the plurality of field devices and to convert the received signal from a first form to a second form.

6. A process control system according to any one of the preceding aspects, wherein the distributed marshaling module further comprises: a scanning module operable to scan each of the electronic marshaling component slots and, for any slot in which there is an electronic marshaling component, to register a value associated with the slot.

7. A process control system according to aspect 6, wherein the microprocessor on the distributed marshaling module functions as the scanning module.

8. A process control system according to either aspect 6 or aspect 7, wherein the microprocessor on the distributed marshaling module transmits the value associated with the slot on one of the pair of communication ports.

9. A process control system according to any one of the preceding aspects, wherein the microprocessor on the distributed marshaling module, by default, transmits data through a first one of the pair of communication ports, and receives data through a second one of the pair of communication ports.

10. A process control system according to any one of the preceding aspects, wherein the microprocessor on the distributed marshaling module transmits information on a given one of the pair of communication ports only if the microprocessor on the distributed marshaling module has detected a heartbeat signal on the given one of the pair of communication ports within a pre-defined time period prior to transmitting.

11. A process control system according to any one of the preceding aspects, wherein the microprocessor on the head-end module, by default, transmits data through a first one of the pair of second communication ports, and receives data through a second one of the pair of second communication ports.

12. A process control system according to any one of the preceding aspects, wherein the microprocessor on the head-end module transmits information on a given one of the pair of second communication ports only if the microprocessor on the head-end module has detected a heartbeat signal on the given one of the pair of second communication ports within a pre-defined time period prior to transmitting.

13. A process control system according to any one of the preceding aspects, wherein the I/O card is disposed on the head-end module.

14. A process control system according to any one of the preceding aspects, wherein the electronic marshaling component is one of an AO electronic marshaling component, an AI electronic marshaling component, a DO electronic marshaling component, or a DI electronic marshaling component.

15. A process control system according to any one of the preceding aspects, wherein the microprocessor on the head-end module is further configured to: receive data from the controller via the I/O card; associate the data received from the controller with a destination address specifying one of a destination distributed marshaling module associated with a specific one of the field devices, a destination electronic marshaling component associated with the specific one of the field devices, or the specific one of the field devices; and transmit the data received from the controller, and the associated destination address, to the specific one of the field devices by the transmitting the data on one of the pair of second communication ports.

16. A process control system according to aspect 15, wherein a first one of the pair of communication ports on the distributed marshaling module is communicatively coupled to the one of the pair of second communication ports on which the microprocessor on the head-end module transmitted the data, and further wherein: the microprocessor on the distributed marshaling module receives the data transmitted from the head-end module, determines whether the destination address is associated with the distributed marshaling module, and: if the destination address is associated with the distributed marshaling module, routes the data to the specific one of the field devices, if the destination address is not associated with the distributed marshaling module, transmits the data and the associated destination address on the second one of the pair of communication ports on the distributed marshaling module.

17. A process control system according to any one of the preceding aspects, wherein the microprocessor on the distributed marshaling module is configured to: receive data, including a destination address, on a first one of the pair of communication ports and, if the destination address specifies the head-end module, transmit the data, including the destination address, on the second one of the pair of communication ports.

18. A process control system according to any one of the preceding aspects, wherein each of the pair of second communication ports is coupled to one of the pair of communication ports on the distributed marshaling module by an Ethernet connection.

19. A process control system according to any one of the preceding aspects, wherein an Ethernet connection communicatively connects the head-end module to the distributed marshaling module.

20. A process control system operating to control a process in a process plant, comprising: a plurality of process control field devices; an input/output (I/O) card communicatively coupled to the plurality of process control field devices; a controller, communicatively coupled to the I/O card and receiving, via the I/O card, data from the plurality of process control field devices, and operating to send, also via the I/O card, control signals to one or more of the process control field devices to control the operation of the process; a plurality of distributed marshaling modules, each distributed marshaling module comprising: a pair of communication ports; a plurality of electronic marshaling component slots; an electronic marshaling component disposed in an electronic marshaling component slot; and a respective terminal block corresponding to each of the plurality of electronic marshaling component slots, the terminal block for the electronic marshaling component slot in which the electronic marshaling component is disposed being communicatively coupled to one of the plurality of field devices; and a microprocessor, coupled to the pair of communication ports; and a head-end module comprising: a first communication port coupling the head-end module to the I/O card; a second communication port communicatively coupled to a first one of the plurality of distributed marshaling modules; a third communication port communicatively coupled to a second one of the plurality of distributed marshaling modules; a memory device having stored thereon a database storing information received by the microprocessor via the second and third communication ports; and a microprocessor, coupled to the memory device, configured to: receive and transmit data via the second and third communication ports; store received data to the memory device; retrieve data from the memory device; and transmit retrieved data to the controller via the I/O card.

21. A distributed marshaling module for coupling field devices in a process plant to a controller in the process plant, comprising: a pair of communication ports; a first number of electronic marshaling component slots; a second number, equal to the first number, of terminal blocks, each terminal block in communicative connection with one of the electronic marshaling component slots and configured to be communicatively connected to a respective one of the field devices; a third number, less than or equal to the first number, of electronic marshaling components disposed in the electronic marshaling component slots, each of the electronic marshaling components configured to receive a signal from the respective one of the field devices and to convert the received signal to a format compatible with an I/O card; and a microprocessor coupled to the pair of communication ports.

22. A distributed marshaling module according to aspect 21, wherein the microprocessor is configured to transmit and receive data on the pair of communication ports.

23. A distributed marshaling module according to either aspect 21 or aspect 22, wherein the microprocessor is configured to transmit on a first one of the pair of communication ports by default, and to receive on a second one of the pair of communication ports by default.

24. A distributed marshaling module according to aspect 23, wherein the microprocessor is further configured to transmit on the second one of the pair of communication ports instead of the first one of the pair of communication ports if the microprocessor has not received an expected periodic heartbeat signal on the first one of the pair of communication ports within a predetermined period of time prior to transmitting.

25. A distributed marshaling module according to any one of aspects 21 to 24, wherein the microprocessor is configured to transmit a periodic heartbeat signal on each of the pair of communication ports.

26. A distributed marshaling module according to any one of aspects 21 to 25, further comprising a scanning module operable to: scan the electronic marshaling component slots; receive the converted signals from each of the electronic marshaling components; and either communicate the received converted signals to the microprocessor for transmission to a head-end module, or store the received converted signals in a memory device for later retrieval and transmission to the head-end by the microprocessor.

27. A distributed marshaling module according to aspect 26, wherein the microprocessor is configured as the scanning module.

28. A distributed marshaling module according to any one of aspects 21 to 27, wherein the microprocessor is configured to: receive data via one of the pair of communication ports, the received data including a destination address; determine whether the destination address is associated with the distributed marshaling module; and either transmit the received data via one of the pair of communication ports if the destination address is not associated with the distributed marshaling module, or route the received data to a field device communicatively coupled to a terminal block on the distributed marshaling module, by routing the received data to the electronic marshaling component corresponding to the field device.

29. A distributed marshaling module according to aspect 28, wherein the destination address specifies one of: (1) a head-end; (2) a field device coupled to the distributed marshaling module; or (3) a field device coupled to another distributed marshaling module.

30. A distributed marshaling module according to aspect 28, wherein the destination address specifies one of: (1) a head-end; (2) an electronic marshaling component associated with the distributed marshaling module; or (3) an electronic marshaling component associated with another distributed marshaling module.

31. A distributed marshaling module according to aspect 28, wherein the destination address specifies one of: (1) a head-end; (2) the distributed marshaling module; or (3) another distributed marshaling module.

32. A head-end module for coupling field devices in a process plant to a controller in the process plant, comprising: a first communication port communicatively connecting the head-end module to a first distributed marshaling module, the first distributed marshaling module part of a first ring architecture; a second communication port communicatively connecting the head-end module to a second distributed marshaling module, the second distributed marshaling module part of the first ring architecture; a third communication port communicatively connecting the head-end module to an I/O card, the I/O card communicatively connected, in turn, to the controller; a memory device; a microprocessor, coupled to the memory device, and configured to: receive, via one or both of the first and second communication ports, first data from field devices coupled to the first and second distributed marshaling modules; store the received first data to a database disposed in the memory device; retrieve the received first data from the database; transmit the retrieved first data to the controller via the I/O card; receive second data from the controller via the I/O card; and transmit, via one or both of the first and second communication ports, the second data to specified ones of the field devices.

33. A head-end module according to aspect 32, wherein the microprocessor is configured to transmit on a first one of the first and second communication ports by default, and to receive on a second one of the first and second communication ports by default.

34. A head-end module according to aspect 33, wherein the microprocessor is further configured to transmit on the second communication port instead of the first communication port if the microprocessor has not received an expected periodic heartbeat signal on the first communication port within a predetermined period of time prior to transmitting.

35. A head-end module according to any one of aspects 32 to 34, wherein the microprocessor is configured to transmit a periodic heartbeat signal on each of the first and second communication ports.

36. A head-end module according to any one of aspects 32 to 35, wherein the microprocessor is configured to: receive data via one of the first or second communication ports, the received data including a destination address; determine whether the destination address is an address of the head-end module; and either transmit the received data via one of the first or second communication ports if the destination address is not the address of the head-end module or, if the destination address is the address of the head-end module, store the received data in the database.

37. A head-end module according to aspect 36, wherein the destination address specifies one of: (1) the head-end; or (2) a field device coupled to one of the distributed marshaling modules.

38. A head-end module according to aspect 36, wherein the destination address specifies one of: (1) the head-end; or (2) an electronic marshaling component associated with one of the distributed marshaling modules.

39. A head-end module according to aspect 36, wherein the destination address specifies one of: (1) the head-end; or (2) one of the distributed marshaling modules.

40. A head-end module according to any one of aspects 32 to 39, further comprising: a fourth communication port communicatively connecting the head-end module to a third distributed marshaling module, the third distributed marshaling module part of a second ring architecture; and a fifth communication port communicatively connecting the head-end module to a fourth distributed marshaling module, the fourth distributed marshaling module part of the second ring architecture.

41. A method of communicating data from a field device in a process plant to a controller in the process plant, the method comprising: receiving from the field device, at a terminal block, a signal representative of the data; converting, in an electronic marshaling component communicatively connected to the terminal block, the received signal to a second signal; registering the second signal from the electronic marshaling component; and transmitting, from a microprocessor, to a head-end module remote from the microprocessor and the electronic marshaling component, via either a first communication port or a second communication port, a signal indicative of the registered second signal.

42. The method according to aspect 41, wherein the signal indicative of the registered second signal is transmitted to the head-end module via the first communication port, by default, and via the second communication port if no periodic heartbeat signal is detected on the first communication port within a predetermined period before transmitting.

43. The method according to either aspect 41 or aspect 42, wherein the electronic marshaling component is one of: an AO electronic marshaling component, an AI electronic marshaling component, a DO electronic marshaling component, or a DI electronic marshaling component.

44. The method according to any one of aspects 41 to 43, wherein the head-end module is communicatively coupled to the controller via one or more I/O cards.

45. The method according to any one of aspects 41 to 44, wherein transmitting the signal indicative of the registered second signal to the head-end module comprises transmitting the signal indicative of the registered second signal to an intervening distributed marshaling module disposed in the communication path to the head-end module.

46. The method according to any one of aspects 41 to 45, wherein transmitting the signal indicative of the registered second signal to the head-end module comprises transmitting the signal indicative of the registered second signal on a ring communication architecture.

47. The method according to any one of aspects 41 to 46, further comprising transmitting the signal indicative of the registered second signal from the head-end module to the controller, via an I/O card.

48. A process control system operating to control a process in a process plant, comprising: a plurality of process control field devices; an input/output (I/O) card communicatively coupled to the plurality of process control field devices; a controller, communicatively coupled to the I/O card and receiving, via the I/O card, data from the plurality of process control field devices, and operating to send, also via the I/O card, control signals to one or more of the process control field devices to control the operation of the process; a distributed marshaling module comprising: a first communication port; one or more electronic marshaling component slots, at least one electronic marshaling component slot having disposed therein an electronic marshaling component; and a respective terminal block corresponding to each of the one or more electronic marshaling component slots, the terminal block for the at least one electronic marshaling component slot being communicatively coupled to one of the plurality of field devices; a microprocessor, coupled to the first communication port; and a head-end module comprising: a first communication port coupling the head-end module to the I/O card; a second communication port communicatively coupled to the distributed marshaling module; a memory device having stored thereon a database storing information received by the microprocessor via the second communication port; and a microprocessor, coupled to the memory device, configured to: receive and transmit data via the second communication port; store received data to the memory device; retrieve data from the memory device; and transmit retrieved data to the controller via the I/O card.

49. A process control system according to aspect 48, wherein the communication port on the distributed marshaling module cooperates with the second communication port on the head-end module to pass data between the distributed marshaling module and the head-end module.

50. A process control system according to either aspect 48 or aspect 49, wherein the process control system comprises a plurality of distributed marshaling modules.

51. A process control system according to any one of aspects 48 to 50, wherein the electronic marshaling component is configured to receive a signal from the one of the plurality of field devices and to convert the received signal from a first form to a second form.

52. A process control system according to any one of aspects 48 to 51, wherein the distributed marshaling module further comprises: a scanning module operable to scan each of the electronic marshaling component slots and, for any slot in which there is an electronic marshaling component, to register a value associated with the slot.

53. A process control system according to aspect 52, wherein the microprocessor on the distributed marshaling module functions as the scanning module.

54. A process control system according to either aspect 52 or aspect 53, wherein the microprocessor on the distributed marshaling module transmits the value associated with the slot on the communication port of the distributed marshaling module.

55. A process control system according to any one of aspects 48 to 54, wherein the I/O card is disposed on the head-end module.

56. A process control system according to any one of aspects 48 to 55, wherein the electronic marshaling component is one of an AO electronic marshaling component, an AI electronic marshaling component, a DO electronic marshaling component, or a DI electronic marshaling component.

57. A process control system according to any one of aspects 48 to 56, wherein the microprocessor on the head-end module is further configured to: receive data from the controller via the I/O card; associate the data received from the controller with a destination address specifying one of a destination distributed marshaling module associated with a specific one of the field devices, a destination electronic marshaling component associated with the specific one of the field devices, or the specific one of the field devices; and transmit the data received from the controller, and the associated destination address, to the specific one of the field devices by the transmitting the data on the second communication port.

58. A process control system according to aspect 57, wherein the distributed marshaling module comprises a second communication port and wherein a first one of the first and second communication ports on the distributed marshaling module is communicatively coupled to the second communication port on which the microprocessor on the head-end module transmitted the data, and further wherein: the microprocessor on the distributed marshaling module receives the data transmitted from the head-end module, determines whether the destination address is associated with the distributed marshaling module, and: if the destination address is associated with the distributed marshaling module, routes the data to the specific one of the field devices, if the destination address is not associated with the distributed marshaling module, transmits the data and the associated destination address on the other of the first and second communication ports on the distributed marshaling module.

59. A process control system according to any one of aspects 48 to 56, wherein the distributed marshaling module comprises a second communication port and the second communication port is communicatively coupled to a second distributed marshaling module.

60. A process control system operating to control a process in a process plant, comprising: a plurality of process control field devices; an input/output (I/O) card communicatively coupled to the plurality of process control field devices; a controller, communicatively coupled to the I/O card and receiving, via the I/O card, data from the plurality of process control field devices, and operating to send, also via the I/O card, control signals to one or more of the process control field devices to control the operation of the process; a plurality of distributed marshaling modules, each distributed marshaling module comprising: a pair of communication ports; a plurality of electronic marshaling component slots; an electronic marshaling component disposed in an electronic marshaling component slot; and a respective terminal block corresponding to each of the plurality of electronic marshaling component slots, the terminal block for the electronic marshaling component slot in which the electronic marshaling component is disposed being communicatively coupled to one of the plurality of field devices; and a microprocessor, coupled to the pair of communication ports; and a head-end module comprising: a first communication port coupling the head-end module to the I/O card; a second communication port communicatively coupled to a first one of the plurality of distributed marshaling modules; a memory device having stored thereon a database storing information received by the microprocessor via the second communication port; and a microprocessor, coupled to the memory device, configured to: receive and transmit data via the second communication port; store received data to the memory device; retrieve data from the memory device; and transmit retrieved data to the controller via the I/O card, wherein a first of the plurality of distributed marshaling modules is communicatively coupled to a second of the plurality of distributed marshaling modules by a communication link between a first of the pair of communication ports on the first of the plurality of distributed marshaling modules and a first of the pair of communication ports on the second of the plurality of distributed marshaling modules.

61. A distributed marshaling module for coupling field devices in a process plant to a controller in the process plant, comprising: a pair of communication ports; a first number of electronic marshaling component slots; a second number, equal to the first number, of terminal blocks, each terminal block in communicative connection with one of the electronic marshaling component slots and configured to be communicatively connected to a respective one of the field devices; a third number, less than or equal to the first number, of electronic marshaling components disposed in the electronic marshaling component slots, each of the electronic marshaling components configured to receive a signal from the respective one of the field devices and to convert the received signal to a format compatible with an I/O card; and a microprocessor coupled to the pair of communication ports, the microprocessor configured to: receive data on both of the pair of communication ports; transmit data to a head-end module on a first of the pair of communication ports; and transmit data to another distributed marshaling module on a second of the pair of communication ports.

62. A distributed marshaling module according to aspect 61, further comprising a scanning module operable to: scan the electronic marshaling component slots; receive the converted signals from each of the electronic marshaling components; and either communicate the received converted signals to the microprocessor for transmission to a head-end module, or store the received converted signals in a memory device for later retrieval and transmission to the head-end by the microprocessor.

63. A distributed marshaling module according to either aspect 61 or aspect 62, wherein the microprocessor is configured to: receive data including a destination address; determine whether the destination address is associated with the distributed marshaling module; and either transmit the received data via the second of the pair of communication ports if the destination address is not associated with the distributed marshaling module and not associated with the head-end module, or route the received data to a field device communicatively coupled to a terminal block on the distributed marshaling module, by routing the received data to the electronic marshaling component corresponding to the field device.

64. A distributed marshaling module according to aspect 63, wherein the destination address specifies one of: (1) a head-end; (2) a field device coupled to the distributed marshaling module; or (3) a field device coupled to another distributed marshaling module.

65. A distributed marshaling module according to aspect 63, wherein the destination address specifies one of: (1) a head-end; (2) an electronic marshaling component associated with the distributed marshaling module; or (3) an electronic marshaling component associated with another distributed marshaling module.

66. A distributed marshaling module according to aspect 63, wherein the destination address specifies one of: (1) a head-end; (2) the distributed marshaling module; or (3) another distributed marshaling module.

67. A head-end module for coupling field devices in a process plant to a controller in the process plant, comprising:

a first communication port communicatively connecting the head-end module to a first distributed marshaling module; a second communication port communicatively connecting the head-end module to a second distributed marshaling module; a third communication port communicatively connecting the head-end module to an I/O card, the I/O card communicatively connected, in turn, to the controller; a memory device; a microprocessor, coupled to the memory device, and configured to: transmit and receive, via the first communication port, first data to and from field devices coupled to the first distributed marshaling module; transmit and receive, via the second communication port, second data to and from field devices coupled to the second distributed marshaling module; store the received first data and second data to a database disposed in the memory device; retrieve the received first data and second data from the database; transmit the retrieved first data and second data to the controller via the I/O card; receive third and fourth data from the controller via the I/O card; transmit, via the first communication port, the third data to specified ones of the field devices coupled to the first distributed marshaling module; and transmit, via the second communication port, the fourth data to specified ones of the field devices coupled to the second distributed marshaling module.

What is claimed:

1. A process control system operating to control a process in a process plant, comprising:
 a plurality of process control field devices;
 an input/output (I/O) card communicatively coupled to the plurality of process control field devices;
 a controller, communicatively coupled to the I/O card and receiving, via the I/O card, data from the plurality of process control field devices, and operating to send, also via the I/O card, control signals to one or more of the process control field devices to control the operation of the process;
 a plurality of distributed marshaling modules, each distributed marshaling module comprising:
  a pair of communication ports;
  a plurality of electronic marshaling component slots;
  an electronic marshaling component disposed in an electronic marshaling component slot; and
  a respective terminal block corresponding to each of the plurality of electronic marshaling component slots, the terminal block for the electronic marshaling component slot in which the electronic marshaling component is disposed being communicatively coupled to one of the plurality of field devices; and
  a microprocessor, coupled to the pair of communication ports; and
 a head-end module comprising:
  a first communication port coupling the head-end module to the I/O card;
  a second communication port communicatively coupled to a first one of the plurality of distributed marshaling modules;
  a third communication port communicatively coupled to a second one of the plurality of distributed marshaling modules;
  a memory device having stored thereon a database storing information received by the microprocessor via the second and third communication ports; and
  a microprocessor, coupled to the memory device, configured to:
   receive and transmit data via the second and third communication ports;
   store received data to the memory device;
   retrieve data from the memory device; and
   transmit retrieved data to the controller via the I/O card.

2. A process control system operating to control a process in a process plant, comprising:
 a plurality of process control field devices;
 an input/output (I/O) card communicatively coupled to the plurality of process control field devices;
 a controller, communicatively coupled to the I/O card and receiving, via the I/O card, data from the plurality of process control field devices, and operating to send, also via the I/O card, control signals to one or more of the process control field devices to control the operation of the process;
 a distributed marshaling module comprising:
  a pair of communication ports;
  one or more electronic marshaling component slots, at least one electronic marshaling component slot having disposed therein an electronic marshaling component; and
  a respective terminal block corresponding to each of the one or more electronic marshaling component slots, the terminal block for the at least one electronic marshaling component slot being communicatively coupled to one of the plurality of field devices;
  a microprocessor, coupled to the pair of communication ports; and
 a head-end module comprising:
  a first communication port coupling the head-end module to the I/O card;
  a pair of second communication ports communicatively coupled to the distributed marshaling module;
  a memory device having stored thereon a database storing information received by the microprocessor via the pair of second communication ports; and
  a microprocessor, coupled to the memory device, configured to:
   receive and transmit data via the pair of second communication ports;
   store received data to the memory device;
   retrieve data from the memory device; and
   transmit retrieved data to the controller via the I/O card.

3. A process control system according to claim 2, wherein the pair of communication ports on the distributed marshaling module cooperate with the pair of second communication ports on the head-end module to form a ring architecture.

4. A process control system according to claim 2, wherein the microprocessor on the head-end module sends a periodic heartbeat signal on each of the pair of second communication ports and the microprocessor on the distributed marshaling module sends a periodic heartbeat signal on each of the pair of communication ports.

5. A process control system according to claim 2, wherein the process control system comprises a plurality of distributed marshaling modules.

6. A process control system according to claim 2, wherein the electronic marshaling component is configured to receive a signal from the one of the plurality of field devices and to convert the received signal from a first form to a second form.

7. A process control system according to claim 2, wherein the distributed marshaling module further comprises:
 a scanning module operable to scan each of the electronic marshaling component slots and, for any slot in which there is an electronic marshaling component, to register a value associated with the slot.

8. A process control system according to claim 7, wherein the microprocessor on the distributed marshaling module functions as the scanning module.

9. A process control system according to claim 7, wherein the microprocessor on the distributed marshaling module transmits the value associated with the slot on one of the pair of communication ports.

10. A process control system according to claim 2, wherein the microprocessor on the distributed marshaling module, by default, transmits data through a first one of the pair of communication ports, and receives data through a second one of the pair of communication ports.

11. A process control system according to claim 2, wherein the microprocessor on the distributed marshaling module transmits information on a given one of the pair of communication ports only if the microprocessor on the distributed marshaling module has detected a heartbeat signal on the given one of the pair of communication ports within a pre-defined time period prior to transmitting.

12. A process control system according to claim 2, wherein the microprocessor on the head-end module, by default, transmits data through a first one of the pair of second communication ports, and receives data through a second one of the pair of second communication ports.

13. A process control system according to claim 2, wherein the microprocessor on the head-end module transmits information on a given one of the pair of second communication ports only if the microprocessor on the head-end module has detected a heartbeat signal on the given one of the pair of second communication ports within a pre-defined time period prior to transmitting.

14. A process control system according to claim 2, wherein the I/O card is disposed on the head-end module.

15. A process control system according to claim 2, wherein the electronic marshaling component is one of an AO electronic marshaling component, an AI electronic marshaling component, a DO electronic marshaling component, or a DI electronic marshaling component.

16. A process control system according to claim 2, wherein the microprocessor on the head-end module is further configured to:
receive data from the controller via the I/O card;
associate the data received from the controller with a destination address specifying one of a destination distributed marshaling module associated with a specific one of the field devices, a destination electronic marshaling component associated with the specific one of the field devices, or the specific one of the field devices; and
transmit the data received from the controller, and the associated destination address, to the specific one of the field devices by the transmitting the data on one of the pair of second communication ports.

17. A process control system according to claim 16, wherein a first one of the pair of communication ports on the distributed marshaling module is communicatively coupled to the one of the pair of second communication ports on which the microprocessor on the head-end module transmitted the data, and further wherein:
the microprocessor on the distributed marshaling module receives the data transmitted from the head-end module, determines whether the destination address is associated with the distributed marshaling module, and:
if the destination address is associated with the distributed marshaling module, routes the data to the specific one of the field devices,
if the destination address is not associated with the distributed marshaling module, transmits the data and the associated destination address on the second one of the pair of communication ports on the distributed marshaling module.

18. A process control system according to claim 2, wherein the microprocessor on the distributed marshaling module is configured to:
receive data, including a destination address, on a first one of the pair of communication ports and, if the destination address specifies the head-end module, transmit the data, including the destination address, on the second one of the pair of communication ports.

19. A process control system according to claim 2, wherein each of the pair of second communication ports is coupled to one of the pair of communication ports on the distributed marshaling module by an Ethernet connection.

20. A process control system according to claim 2, wherein an Ethernet connection communicatively connects the head-end module to the distributed marshaling module.

21. A head-end module for coupling field devices in a process plant to a controller in the process plant, comprising:
a first communication port communicatively connecting the head-end module to a first distributed marshaling module, the first distributed marshaling module part of a first ring architecture;
a second communication port communicatively connecting the head-end module to a second distributed marshaling module, the second distributed marshaling module part of the first ring architecture;
a third communication port communicatively connecting the head-end module to an I/O card, the I/O card communicatively connected, in turn, to the controller;
a memory device;
a microprocessor, coupled to the memory device, and configured to:
receive, via one or both of the first and second communication ports, first data from field devices coupled to the first and second distributed marshaling modules;
store the received first data to a database disposed in the memory device;
retrieve the received first data from the database;
transmit the retrieved first data to the controller via the I/O card;
receive second data from the controller via the I/O card; and
transmit, via one or both of the first and second communication ports, the second data to specified ones of the field devices.

22. A head-end module according to claim 21, wherein the microprocessor is configured to transmit on a first one of the first and second communication ports by default, and to receive on a second one of the first and second communication ports by default.

23. A head-end module according to claim 22, wherein the microprocessor is further configured to transmit on the second communication port instead of the first communication port if the microprocessor has not received an expected periodic heartbeat signal on the first communication port within a predetermined period of time prior to transmitting.

24. A head-end module according to claim 21, wherein the microprocessor is configured to transmit a periodic heartbeat signal on each of the first and second communication ports.

25. A head-end module according to claim 21, wherein the microprocessor is configured to:
- receive data via one of the first or second communication ports, the received data including a destination address;
- determine whether the destination address is an address of the head-end module; and
- either transmit the received data via one of the first or second communication ports if the destination address is not the address of the head-end module or, if the destination address is the address of the head-end module, store the received data in the database.

26. A head-end module according to claim 25, wherein the destination address specifies one of: (1) the head-end; or (2) a field device coupled to one of the distributed marshaling modules.

27. A head-end module according to claim 25, wherein the destination address specifies one of: (1) the head-end; or (2) an electronic marshaling component associated with one of the distributed marshaling modules.

28. A head-end module according to claim 25, wherein the destination address specifies one of: (1) the head-end; or (2) one of the distributed marshaling modules.

29. A head-end module according to claim 21, further comprising:
- a fourth communication port communicatively connecting the head-end module to a third distributed marshaling module, the third distributed marshaling module part of a second ring architecture; and
- a fifth communication port communicatively connecting the head-end module to a fourth distributed marshaling module, the fourth distributed marshaling module part of the second ring architecture.

* * * * *